(12) United States Patent
Kaneko et al.

(10) Patent No.: US 10,361,089 B2
(45) Date of Patent: Jul. 23, 2019

(54) PLASMA PROCESSING METHOD

(71) Applicant: TOKYO ELECTRON LIMITED, Tokyo (JP)

(72) Inventors: Kengo Kaneko, Miyagi (JP); Jun Hirose, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/989,291

(22) Filed: May 25, 2018

(65) Prior Publication Data

US 2018/0350569 A1 Dec. 6, 2018

(30) Foreign Application Priority Data

May 30, 2017 (JP) ................ 2017-106733

(51) Int. Cl.
| | |
|---|---|
| *H01L 21/3065* | (2006.01) |
| *H01J 37/32* | (2006.01) |
| *H01L 21/67* | (2006.01) |
| *H01L 21/683* | (2006.01) |
| *H01L 21/311* | (2006.01) |
| *H01L 21/3213* | (2006.01) |

(52) U.S. Cl.
CPC .... *H01L 21/3065* (2013.01); *H01J 37/32724* (2013.01); *H01L 21/31116* (2013.01); *H01L 21/31138* (2013.01); *H01L 21/31144* (2013.01); *H01L 21/32137* (2013.01); *H01L 21/67103* (2013.01); *H01L 21/67248* (2013.01); *H01L 21/6833* (2013.01); *H01J 2237/2001* (2013.01); *H01J 2237/334* (2013.01); *H01L 21/67069* (2013.01); *H01L 21/6831* (2013.01)

(58) Field of Classification Search
None
See application file for complete search history.

(56) References Cited

U.S. PATENT DOCUMENTS

| | | | |
|---|---|---|---|
| 2014/0154819 A1* | 6/2014 | Gaff | H01L 21/67109 438/17 |
| 2015/0132863 A1* | 5/2015 | Oohashi | H01J 37/32082 438/5 |

FOREIGN PATENT DOCUMENTS

JP  2016-6875 A  1/2016

* cited by examiner

*Primary Examiner* — Jiong-Ping Lu
(74) *Attorney, Agent, or Firm* — Rothwell, Figg, Ernst & Manbeck, P.C.

(57) ABSTRACT

A plasma processing method according to an exemplary embodiment includes a process of applying a first plasma processing to a substrate in a chamber, and a process of applying a second plasma processing to the substrate in the chamber. In the process of applying the first plasma processing, a plurality of first heaters in a chuck main body of an electrostatic chuck are driven, and a plurality of second heaters in the chuck main body are driven. In the process of applying the second plasma processing, the driving of at least the plurality of second heaters is stopped.

7 Claims, 15 Drawing Sheets

PLASMA PROCESSING METHOD

CROSS-REFERENCE TO RELATED APPLICATIONS

This application is based on and claims priority from Japanese Patent Application No. 2017-106733 filed on May 30, 2017, with the Japan Patent Office, the disclosures of which are incorporated herein in their entirety by reference.

TECHNICAL FIELD

An exemplary embodiment of the present disclosure relates to a plasma processing method.

BACKGROUND

A plasma processing apparatus is used to manufacture an electronic device such as a semiconductor device. In general, the plasma processing apparatus has a chamber main body and a stage. The chamber main body provides an internal space thereof as a chamber. The stage is provided in the chamber. The stage is configured to support a substrate placed on the stage.

The stage includes an electrostatic chuck. The electrostatic chuck has a base and a chuck main body. The base is connected to a high-frequency power source. The chuck main body is provided on the base. The chuck main body is configured to generate electrostatic attractive force between the chuck main body and the substrate placed on the chuck main body, thereby holding the substrate using the generated electrostatic attractive force.

In general, the stage has a temperature adjusting function. Japanese Patent Laid-Open Publication No. 2016-006875 discloses a plasma processing apparatus provided with a stage having a temperature adjusting function. A flow path through which a heat exchange medium (e.g., refrigerant) is supplied is formed in the stage of the plasma processing apparatus disclosed in Japanese Patent Laid-Open Publication No. 2016-006875. In addition, a plurality of heaters (resistance heating heaters) are provided in the chuck main body. Each of the plurality of heaters is driven by alternating current from an alternating current power source.

SUMMARY

In one aspect, a plasma processing method is provided. The plasma processing method is performed by using a plasma processing apparatus. The plasma processing apparatus has a chamber main body, a stage, and a high-frequency power source. The chamber main body provides an internal space thereof as a chamber. The stage is configured to support a substrate in the chamber. The stage has a power feeding unit and an electrostatic chuck. The power feeding unit provides a transmission path for transmitting high-frequency waves from the high-frequency power source. The electrostatic chuck has a base and a chuck main body. The base has conductivity, is provided on the power feeding unit, and is electrically connected to the power feeding unit. The chuck main body is provided on the base and configured to hold the substrate with electrostatic attractive force. The chuck main body has a plurality of first heaters and a plurality of second heaters. The plurality of first heaters are provided in the chuck main body to be distributed on a plane in the chuck main body which is orthogonal to a central axis of the chuck main body. The number of second heaters is larger than the number of first heaters. The plurality of second heaters are provided in the chuck main body to be distributed on a separate plane in the chuck main body which is orthogonal to a central axis of the chuck main body. The plasma processing apparatus further includes a first heater controller and a second heater controller. The first heater controller is configured to drive the plurality of first heaters by an alternating current output or a direct current output from a first power source. The second heater controller is configured to drive the plurality of second heaters by an alternating current output or a direct current output from a second power source which has electric power lower than the electric power of the output from the first power source.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
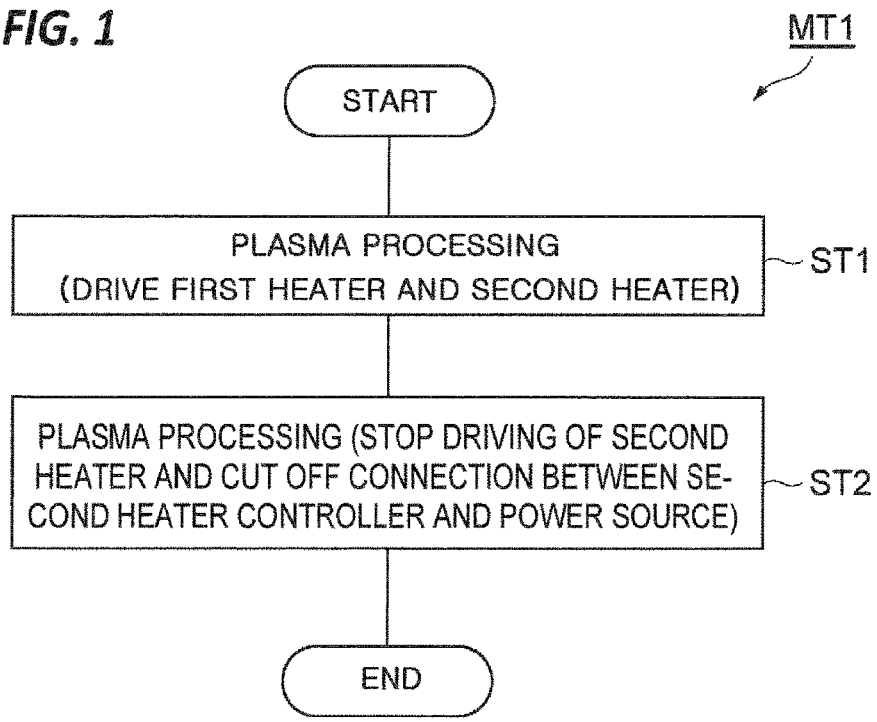
FIG. 1 is a flowchart illustrating a plasma processing method according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the plasma processing, the substrate is subjected to a plurality of processes in some instances. During the plurality of processes, power of high-frequency waves supplied to the base and required in-plane temperature distributions of the substrate vary. Typically, a plurality of plasma processing apparatuses, which are exclusive to the plurality of processes, respectively, are used to apply the plurality of processes to the substrate. In this background, it is required to perform the plurality of processes, which have different power of the high-frequency waves supplied to the base and different required in-plane temperature distributions of the substrate, by using a single plasma processing apparatus.

In one aspect, a plasma processing method is provided. The plasma processing method is performed by using a plasma processing apparatus. The plasma processing apparatus has a chamber main body, a stage, and a high-frequency power source. The chamber main body provides an internal space thereof as a chamber. The stage is configured to support a substrate in the chamber. The stage has a power feeding unit and an electrostatic chuck. The power feeding unit provides a transmission path for transmitting high-frequency waves from the high-frequency power source. The electrostatic chuck has a base and a chuck main body. The base has conductivity, is provided on the power feeding unit, and is electrically connected to the power feeding unit. The chuck main body is provided on the base and configured to hold the substrate with electrostatic attractive force. The chuck main body has a plurality of first heaters and a plurality of second heaters. The plurality of first heaters are provided in the chuck main body to be distributed on a plane in the chuck main body which is orthogonal to a central axis of the chuck main body. The number of second heaters is larger than the number of first heaters. The plurality of second heaters are provided in the chuck main body to be distributed on a separate plane in the chuck main body which is orthogonal to a central axis of the chuck main body. The plasma processing apparatus further includes a first heater controller and a second heater controller. The first heater controller is configured to drive the plurality of first heaters by an alternating current output or a direct current output from a first power source. The second heater controller is configured to drive the plurality of second heaters by an alternating current output or a direct current output from a second power source which has electric power lower than the electric power of the output from the first power source.

The plasma processing method according to one aspect is performed in a state in which the substrate is placed on the chuck main body. The plasma processing method includes a process of applying a first plasma processing to the substrate in the chamber, and a process of applying a second plasma processing to the substrate in the chamber. The electric power of the high-frequency waves supplied to the base from the high-frequency power source in the process of applying the second plasma processing is higher than the electric power of the high-frequency waves supplied to the base from the high-frequency power source in the process of applying the first plasma processing. In the process of applying the first plasma processing, the plurality of first heaters are driven by a plurality of first outputs from the first heater controller, and the plurality of second heaters are driven by a plurality of second outputs from the second heater controller. In the process of applying the second plasma processing, the driving of at least the plurality of second heaters is stopped, and the connection between the second power source and the second heater controller is cut off.

In the process of applying the first plasma processing in the plasma processing method according to one aspect, the plurality of first heaters are driven, the plurality of second heaters are driven, and the high-frequency waves having comparatively low power are supplied to the base. That is, the first plasma processing is processing for coping with the precise adjustment of the in-plane temperature distribution of the substrate and the requirement of low power of the high-frequency wave. Meanwhile, in the process of applying the second plasma processing, the driving of at least the plurality of second heaters is stopped, and the high-frequency waves having comparatively high power are supplied to the base. That is, the second plasma processing is processing for coping with lower precision of the in-plane temperature distribution of the substrate and the requirement of higher power of the high-frequency waves in comparison with in the first plasma processing. Therefore, according to the plasma processing method according to one aspect, the plurality of processes having different power of the high-frequency waves supplied to the base and different required in-plane temperature distributions of the substrate are performed by the single plasma processing apparatus. In addition, the connection between the second power source and the second heater controller is cut off while performing the process of applying the second plasma processing. Therefore, the high-frequency waves supplied to the base is prevented from entering the second power source.

In the process of applying the second plasma processing according to one exemplary embodiment, the driving of the plurality of first heaters is stopped, and the connection between the first power source and the first heater controller is cut off. According to the exemplary embodiment, the high-frequency waves supplied to the base is prevented from entering the first power source.

In one exemplary embodiment, a flow path through which a heat exchange medium is supplied is formed in the base. In the process of applying the second plasma processing, a temperature of the substrate is controlled by supplying the heat exchange medium to the flow path in the base.

In the process of applying the second plasma processing according to one exemplary embodiment, the electric power of the high-frequency waves supplied to the base from the high-frequency power source may be 2,000 W or higher.

In one exemplary embodiment, the substrate has an insulating film made of a silicon oxide, an organic film provided on the insulating film, a mask film provided on the organic film, and a resist mask provided on the mask film. The plasma processing method according to the exemplary embodiment further includes a process of applying a third plasma processing to the substrate in the chamber between the process of applying the first plasma processing and the process of applying the second plasma processing, and a process of applying a fourth plasma processing to the substrate in the chamber between the process of applying the third plasma processing and the process of applying the second plasma processing. In the process of applying the first plasma processing, active species of hydrogen from plasma of hydrogen-containing gas generated in the chamber are supplied to the resist mask. In the process of applying the third plasma processing, the plurality of first heaters are driven, the plurality of second heaters are driven, and the mask film is etched by the active species from the plasma of the processing gas generated in the chamber. In the process of applying the fourth plasma processing, the plurality of first heaters are driven, the plurality of second heaters are driven, and the organic film is etched by the active species from the plasma of the processing gas generated in the chamber. The electric power of the high-frequency waves supplied to the base from the high-frequency power source in the process of applying the second plasma processing is higher than the electric power of the high-frequency waves supplied to the base from the high-frequency power source in the process of applying the third plasma processing and the electric power of the high-frequency waves supplied to the base from the high-frequency power source in the process of applying the fourth plasma processing. In the process of applying the second plasma processing, the insulating film is etched by the active species of the plasma of the processing gas generated in the chamber. In the exemplary embodiment, the resist mask is reformed by the first plasma processing, the mask film is etched by the third plasma processing, and the organic film is etched by the fourth plasma processing. Since the reforming of the resist mask, the etching of the mask film, and the etching of the organic film are performed to form a mask for etching the insulating film, it is necessary to perform the processing with high precision. The first plasma processing, the third plasma processing, and the fourth plasma processing are suitable to reform the resist mask, etch the mask film, and etch the organic film because the first plasma processing, the third plasma processing, and the fourth plasma processing use the high-frequency waves having comparatively low power in a state in which the in-plane temperature distribution of the substrate is precisely adjusted. Meanwhile, in the second plasma processing, the driving of at least the plurality of second heaters is stopped, and the insulating film is etched by using the high-frequency waves having high power. The second plasma processing is suitable for the etching of the insulating film which does not require the precise adjustment of the in-plane temperature distribution of the substrate but requires the usage of the high-frequency waves having high power.

In one exemplary embodiment, the plasma processing method further includes a process of applying separate plasma processing to the substrate in the chamber. The electric power of the high-frequency waves supplied to the base from the high-frequency power source in the process of applying the second plasma processing is higher than the electric power of the high-frequency waves supplied to the base from the high-frequency power source in the process of applying the first plasma processing. The electric power of the high-frequency waves supplied to the base from the high-frequency power source in the process of applying the separate plasma processing is higher than the electric power of the high-frequency waves supplied to the base from the high-frequency power source in the process of applying the second plasma processing. In the process of applying the second plasma processing, the plurality of first heaters are driven, the driving of the plurality of second heaters is stopped, and the connection between the second power source and the second heater controller is cut off. In the process of applying the separate plasma processing, the driving of the plurality of first heaters is stopped, the connection between the first power source and the first heater controller is cut off, the driving of the plurality of second heaters is stopped, and the connection between the second power source and the second heater controller is cut off.

In one exemplary embodiment, the first heater controller is configured to drive the plurality of first heaters by alternating current by the plurality of first outputs of alternating current generated by distributing an alternating current output which is an output from the first power source. The second heater controller is configured to drive the plurality of second heaters by direct current by the plurality of second outputs of direct current generated by distributing a direct current output which is an output from the second power source.

As described above, it is possible to perform the plurality of processes, which have different power of the high-frequency waves supplied to the base and different required in-plane temperature distributions of the substrate, by using the single plasma processing apparatus.

Hereinafter, various exemplary embodiments will be described in detail with reference to the drawings. Further, in the respective drawings, like reference numerals denote like parts or corresponding parts.

Figure 2:
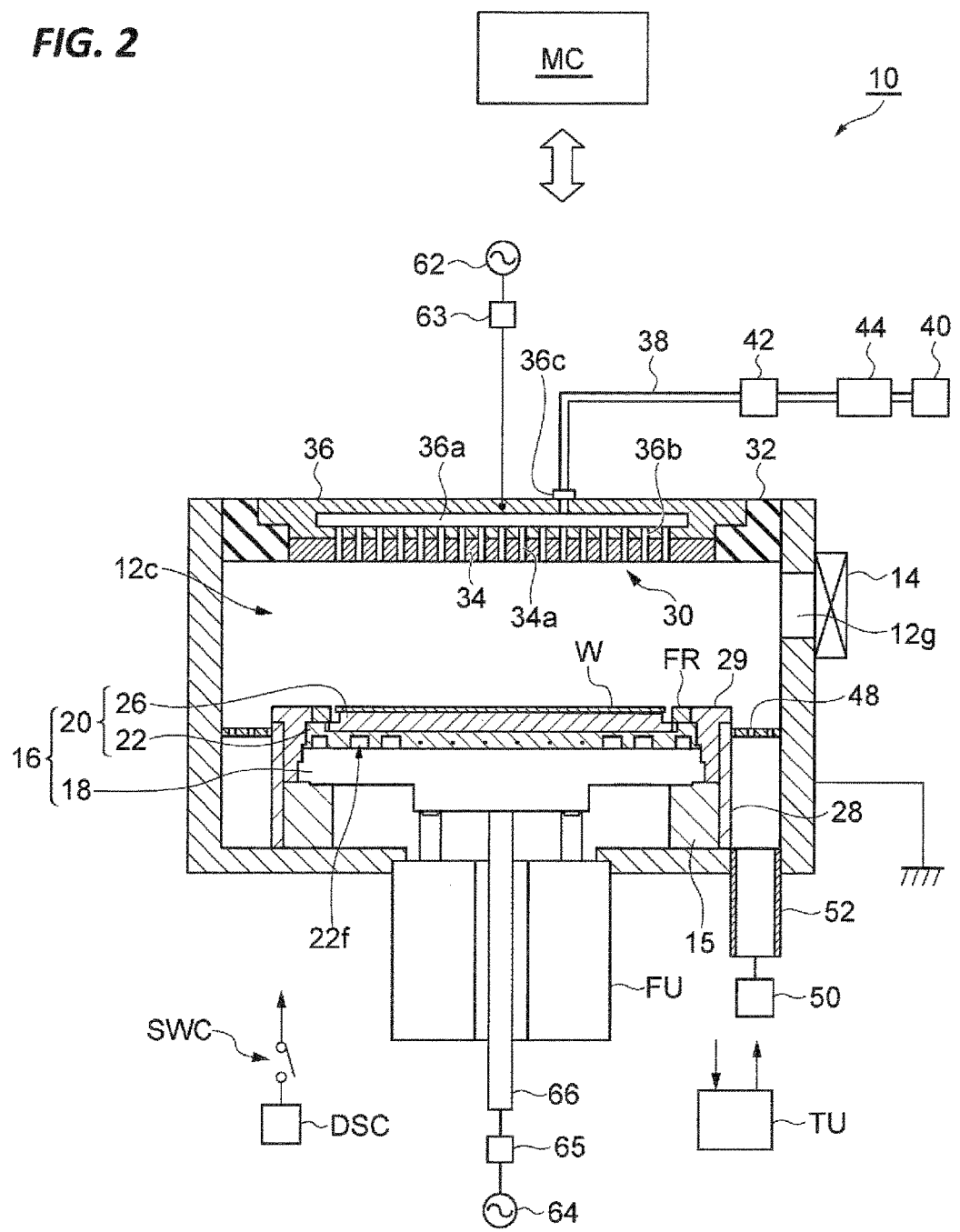
FIG. 2 is a view schematically illustrating a plasma processing apparatus of an exemplary embodiment which may be used for plasma processing methods according to various exemplary embodiments.

FIG. 1 is a flowchart illustrating a plasma processing method according to an exemplary embodiment. A plasma processing method MT1 illustrated in FIG. 1 is performed by using a plasma processing apparatus. FIG. 2 is a view schematically illustrating a plasma processing apparatus of an exemplary embodiment which may be used for plasma processing methods according to various exemplary embodiments. FIG. 2 schematically illustrates a longitudinal sectional structure of a plasma processing apparatus 10 according to an exemplary embodiment. The plasma processing apparatus 10 illustrated in FIG. 2 is a capacitively coupled plasma processing apparatus.

The plasma processing apparatus 10 has a chamber main body 12. The chamber main body 12 has a roughly cylindrical shape. The chamber main body 12 provides an internal space thereof as a chamber 12c. The chamber main body 12 is made of, for example, aluminum. The chamber main body 12 is connected to ground potential. A plasma-resistant film is formed on an inner wall surface of the chamber main body 12, that is, a wall surface that defines the chamber 12c. The film may be a film formed by an anodization treatment or a ceramic film such as a film made of an yttrium oxide. A passageway 12g is formed in a sidewall of the chamber main body 12. A substrate W passes through the passageway 12g when the substrate W is loaded into the chamber 12c and when the substrate W is unloaded from the chamber 12c. A gate valve 14 is mounted on the sidewall of the chamber main body 12. The passageway 12g is openable or closable by the gate valve 14.

In the chamber 12c, a support unit 15 extends upward from a bottom portion of the chamber main body 12. The support unit 15 has a roughly cylindrical shape and is made of an insulating material such as quartz. A stage 16 is placed on the support unit 15. The stage 16 is supported by the support unit 15.

The stage 16 is configured to support the substrate W in the chamber 12c. The stage 16 includes a power feeding unit 18 and an electrostatic chuck 20. The power feeding unit 18 provides a transmission path for transmitting high-frequency waves from a high-frequency power source to be described below. The electrostatic chuck 20 is provided on the power feeding unit 18. The electrostatic chuck 20 includes a base 22 and a chuck main body 26. The base 22 has conductivity and constitutes a lower electrode. The base 22 is provided on the power feeding unit 18 and electrically connected to the power feeding unit 18.

A flow path 22*f* is provided in the base 22. The flow path 22*f* is a flow path for a heat exchange medium. The heat exchange medium is, for example, a refrigerant. The heat exchange medium is supplied to the flow path 22*f* from a chiller unit TU provided outside the chamber main body 12. The heat exchange medium supplied to the flow path 22*f* returns back to the chiller unit TU. As described above, the heat exchange medium is supplied to the flow path 22*f* so that the heat exchange medium circulates between the flow path 22*f* and the chiller unit.

The chuck main body 26 is provided on the base 22. The chuck main body 26 is fixed to the base 22 by, for example, an adhesive. The chuck main body 26 is configured to hold the substrate W with electrostatic attractive force. An electrode 26*a* is provided in the chuck main body 26 (see FIG. 3). The electrode 26*a* is a film-shaped electrode. A direct current power source DSC is connected to the electrode 26*a* via a switch SWC. When voltage is applied to the electrode 26*a* from the direct current power source DSC, the electrostatic attractive force is generated between the chuck main body 26 and the substrate W placed on the chuck main body 26. The substrate W is attracted to the chuck main body 26 by the generated electrostatic attractive force, and the substrate W is held by the chuck main body 26. In addition, the plasma processing apparatus 10 provides a gas supply line for supplying a heat transfer gas, for example, He gas between an upper surface of the chuck main body 26 and a rear surface of the substrate W from a gas supply mechanism.

A cylindrical portion 28 extends upward from the bottom portion of the chamber main body 12. The cylindrical portion 28 extends along an outer circumference of the support unit 15. The cylindrical portion 28 has conductivity and has a roughly cylindrical shape. The cylindrical portion 28 is connected to ground potential. An insulating unit 29 is provided on the support unit 15. The insulating unit 29 has an insulation property and is made of ceramic such as quartz. The insulating unit 29 has a roughly cylindrical shape and extends along an outer circumference of the power feeding unit 18 and an outer circumference of the electrostatic chuck 20. A focus ring FR is mounted within outer circumferential regions of the base 22 and the chuck main body 26. The focus ring FR has a roughly annular plate shape and is made of, for example, silicon or a silicon oxide. The focus ring FR is provided to surround an edge of a substrate mounting region of the chuck main body 26 and surround an edge of the substrate W.

The plasma processing apparatus 10 further includes an upper electrode 30. The upper electrode 30 is provided above the stage 16. The upper electrode 30, together with a member 32, closes an upper opening of the chamber main body 12. The member 32 has an insulation property. The upper electrode 30 is supported at an upper side of the chamber main body 12 through the member 32.

The upper electrode 30 includes a top plate 34 and a support body 36. A lower surface of the top plate 34 defines the chamber 12*c*. A plurality of gas discharge holes 34*a* are formed in the top plate 34. Each of the plurality of gas discharge holes 34*a* penetrates the top plate 34 in a plate thickness direction (vertical direction). The top plate 34 is made of, but not limited to, for example, silicon. Alternatively, the top plate 34 may have a structure in which a plasma-resistant film is provided on a surface of a base material made of aluminum. The film may be a film formed by an anodization treatment or a ceramic film such as a film made of an yttrium oxide.

The support body 36 is a component for supporting the top plate 34 so that the top plate 34 is detachably mounted. The support body 36 may be made of an electrically conductive material such as, for example, aluminum. A gas diffusion chamber 36*a* is provided in the support body 36. A plurality of gas holes 36*b* extend downward from the gas diffusion chamber 36*a*. The plurality of gas holes 36*b* communicate with the plurality of gas discharge holes 34*a*, respectively. A gas introducing port 36*c*, which guides gas into the gas diffusion chamber 36*a*, is formed in the support body 36, and a gas supply pipe 38 is connected to the gas introducing port 36*c*.

A gas source group 40 is connected to the gas supply pipe 38 via a valve group 42 and a flow rate controller group 44. The gas source group 40 includes a plurality of gas sources. The valve group 42 includes a plurality of valves, and the flow rate controller group 44 includes a plurality of flow rate controllers. Each of the plurality of flow rate controllers of the flow rate controller group 44 is a mass flow controller or a pressure-control flow rate controller. Each of the plurality of gas sources of the gas source group 40 is connected to the gas supply pipe 38 via the corresponding valve of the valve group 42 and the corresponding flow rate controller of the flow rate controller group 44. The plasma processing apparatus 10 may supply the chamber 12*c* with gas from one or more gas sources selected from the plurality of gas sources of the gas source group 40 at an individually adjusted flow rate.

A baffle plate 48 is provided between the cylindrical portion 28 and the sidewall of the chamber main body 12. The baffle plate 48 may be configured by, for example, coating a base material made of aluminum with ceramic such as an yttrium oxide. A plurality of through holes are formed in the baffle plate 48. Below the baffle plate 48, a gas discharge pipe 52 is connected to the bottom portion of the chamber main body 12. A gas discharge device 50 is connected to the gas discharge pipe 52. The gas discharge device 50 has a pressure controller such as an automatic pressure control valve, and a vacuum pump such as a turbo molecular pump, and may reduce pressure in the chamber 12*c*.

The plasma processing apparatus 10 further includes a first high-frequency power source 62. The first high-frequency power source 62 is a power source that generates first high-frequency waves for generating plasma. The first high-frequency waves have a frequency ranging from 27 to 100 MHz, for example, a frequency of 60 MHz. The first high-frequency power source 62 is connected to the upper electrode 30 via a matching device 63. The matching device 63 has a circuit for matching output impedance of the first high-frequency power source 62 with impedance at a load side (upper electrode 30 side). Further, the first high-frequency power source 62 may be connected to the power feeding unit 18 via the matching device 63. The upper electrode 30 is connected to the ground potential in the case in which the first high-frequency power source 62 is connected to the power feeding unit 18.

The plasma processing apparatus 10 further includes a second high-frequency power source 64. The second high-frequency power source 64 is a power source that generates second high-frequency bias waves for putting ions into the substrate W. The frequency of the second high-frequency waves is lower than the frequency of the first high-frequency wave. The second high-frequency waves have a frequency ranging from 400 kHz to 13.56 MHz, for example, a frequency of 400 kHz. The second high-frequency power source 64 is connected to the power feeding unit 18 via a matching device 65 and a power supplier 66. The matching device 65 has a circuit for matching output impedance of the second high-frequency power source 64 with impedance at the load side (power feeding unit 18 side).

In one exemplary embodiment, the plasma processing apparatus 10 may further include a main control unit MC. The main control unit MC is a computer having a processor, a storage device, an input device, a display device, and the like, and controls respective parts of the plasma processing apparatus 10. Specifically, the main control unit MC executes a control program stored in the storage device and controls respective parts of the plasma processing apparatus 10 based on recipe data stored in the storage device. Therefore, the plasma processing apparatus 10 is configured to perform a process assigned based on the recipe data.

Figure 3:
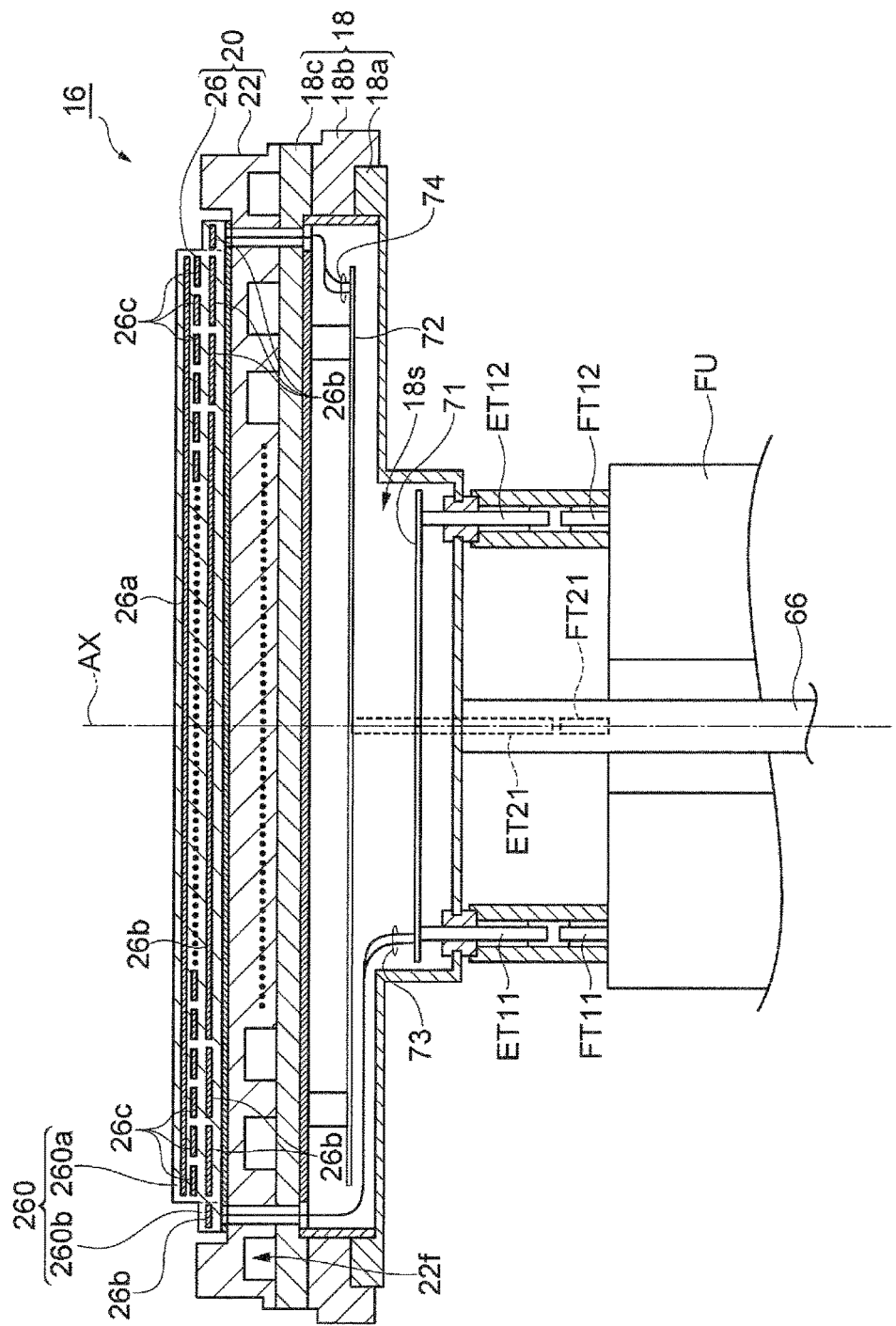
FIG. 3 is a cross-sectional view of a stage according to the exemplary embodiment.
Figure 4:
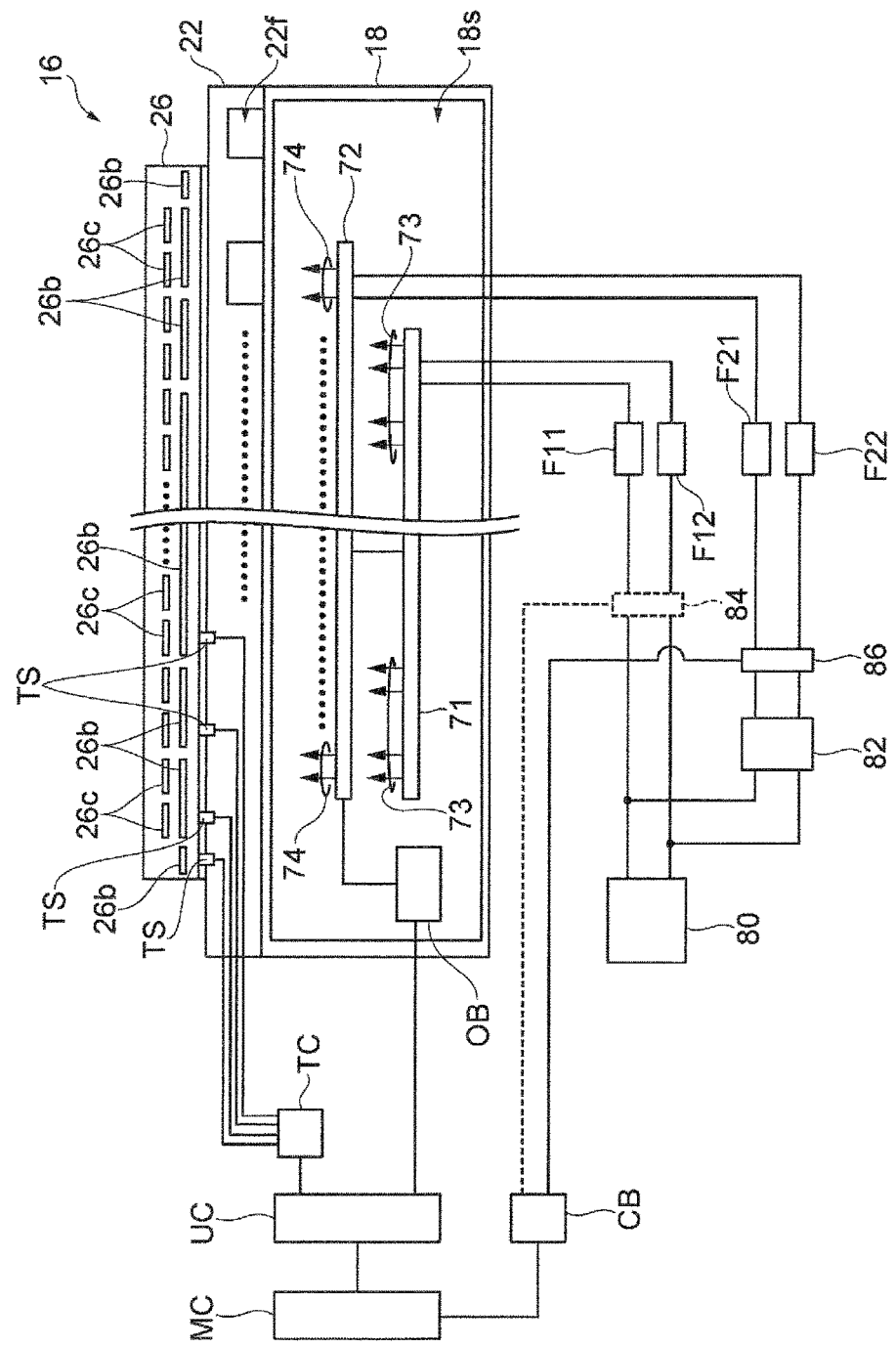
FIG. 4 is a view schematically illustrating the stage according to the exemplary embodiment together with other constituent components of the plasma processing apparatus.

Hereinafter, the stage 16 will be described in detail. FIG. 3 is a cross-sectional view of the stage according to the exemplary embodiment. FIG. 4 is a view schematically illustrating the stage according to the exemplary embodiment together with other constituent components of the plasma processing apparatus. As illustrated in FIGS. 3 and 4, the stage 16 has the power feeding unit 18 and the electrostatic chuck 20.

As described above, the power feeding unit 18 provides a transmission path for the high-frequency waves from the high-frequency power source (e.g., second high-frequency power source 64). The power feeding unit 18 has conductivity and is made of, for example, metal. The aforementioned power supplier 66 is connected to the power feeding unit 18. In one exemplary embodiment, the power feeding unit 18 provides an internal space thereof as an accommodation space 18s.

In one exemplary embodiment, the power feeding unit 18 has a first member 18a, a second member 18b, and a third member 18c. The first member 18a, the second member 18b, and the third member 18c have conductivity and are made of, for example, metal. The first member 18a is a member having a roughly circular shape in a plan view, and a central portion of the first member 18a protrudes downward. The power supplier 66 is connected to the central portion of the first member 18a. The second member 18b is mounted on the first member 18a and connected to the first member 18a. The second member 18b has a roughly ring shape. The third member 18c is mounted on the second member 18b and connected to the second member 18b. The third member 18c has a roughly disk shape. The first member 18a, the second member 18b, and the third member 18c constitute a transmission path for the high-frequency wave. The assembly including the first member 18a, the second member 18b, and the third member 18c defines the accommodation space 18s.

The electrostatic chuck 20 is provided on the power feeding unit 18. As described above, the electrostatic chuck 20 has the base 22 and the chuck main body 26. The base 22 has a roughly disk shape. As described above, the flow path 22f for the heat exchange medium is formed in the base 22. The base 22 has conductivity and is made of metal such as aluminum. The base 22 is provided on the power feeding unit 18 and electrically connected to the power feeding unit 18. The base 22 constitutes the lower electrode of the plasma processing apparatus 10.

The chuck main body 26 is provided on the base 22. The chuck main body 26 is fixed to the upper surface of the base 22 by, for example, an adhesive. The chuck main body 26 has a ceramic main body 260. The ceramic main body 260 is made of ceramic and has a roughly disk shape.

The ceramic main body 260 has a substrate mounting region 260a and an outer circumferential region 260b. The substrate mounting region 260a is a roughly disk-shaped region. An upper surface of the substrate mounting region 260a is an upper surface of the chuck main body 26 on which the substrate W is placed. The outer circumferential region 260b is a roughly annular plate-shaped region and extends to surround the substrate mounting region 260a. That is, the outer circumferential region 260b extends, outside the substrate mounting region 260a, in a circumferential direction with respect to a central axis AX of the chuck main body 26 and the ceramic main body 260. The substrate mounting region 260a and the outer circumferential region 260b provide a continuous flat lower surface (rear surface) of the chuck main body 26. In the vicinity of a rear surface of the chuck main body 26, an upper surface of the outer circumferential region 260b extends further than the upper surface of the substrate mounting region 260a. As illustrated in FIG. 2, the focus ring FR is mounted in the outer circumferential region 260b.

The chuck main body 26 has the electrode 26a, a plurality of first heaters 26b, and a plurality of second heaters 26c. The electrode 26a extends in a direction orthogonal to the central axis AX in the substrate mounting region 260a. Each of the plurality of first heaters 26b and the plurality of second heaters 26c is a thin film resistance heater. The plurality of first heaters 26b and the plurality of second heaters 26c are provided in the ceramic main body 260. The plurality of first heaters 26b and the plurality of second heaters 26c are provided between the electrode 26a and the rear surface of the chuck main body 26. The plurality of first heaters 26b are distributed on a plane in the chuck main body 26 which is orthogonal to the central axis AX. The number of second heaters 26c is larger than the number of first heaters 26b. The plurality of second heaters 26c are distributed on a separate plane in the chuck main body 26 which is orthogonal to the central axis AX.

Figure 5:
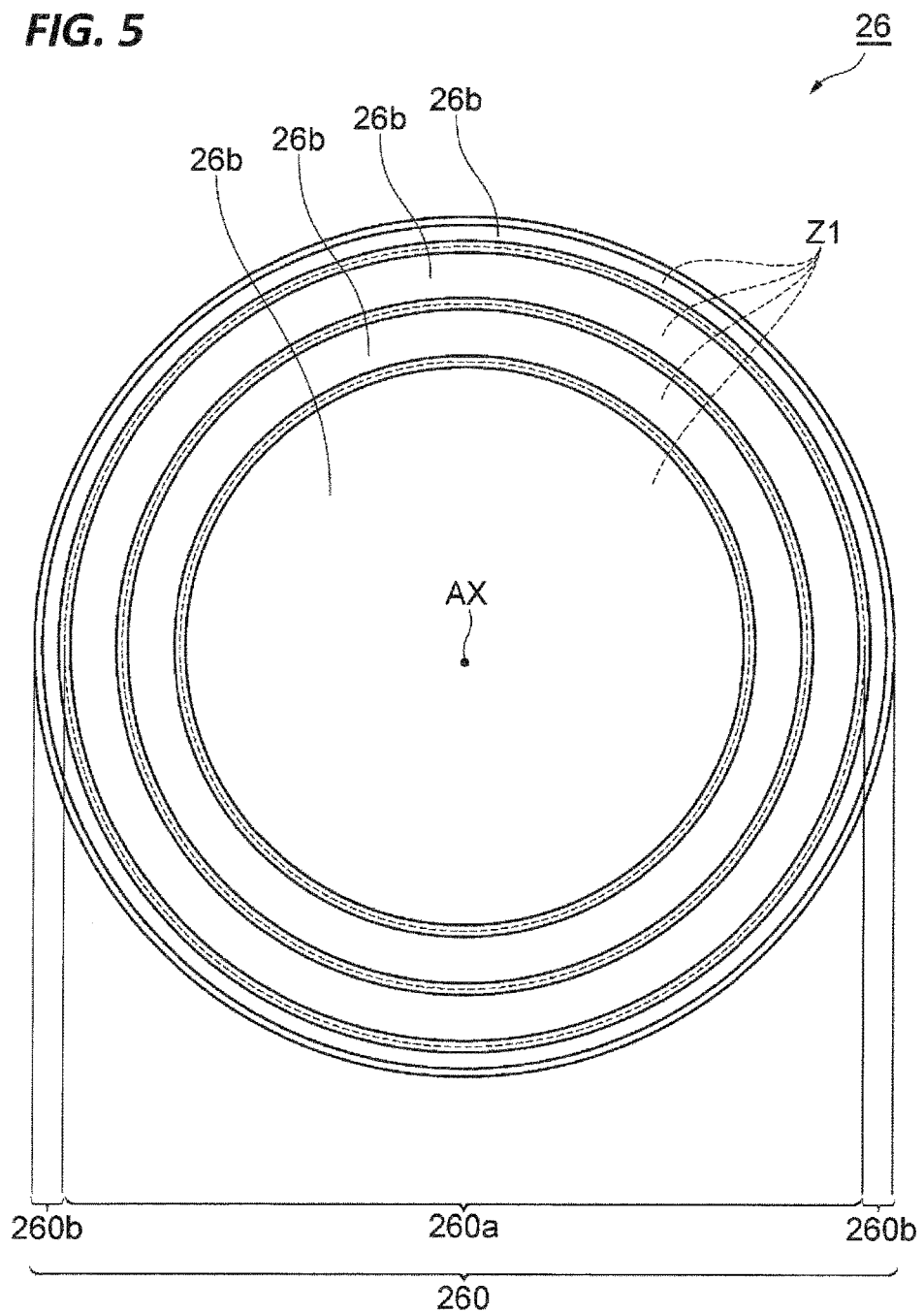
FIG. 5 is a top plan view illustrating an example of a layout of a plurality of first heaters of the stage illustrated in FIG. 3.

FIG. 5 is a top plan view illustrating an example of a layout of the plurality of first heaters of the stage illustrated in FIG. 3. FIG. 5 illustrates a layout of the plurality of first heaters 26b in the plane orthogonal to the central axis AX. As illustrated in FIG. 5, in one exemplary embodiment, the plurality of first heaters 26b are provided coaxially with respect to the central axis AX. Specifically, a plane shape of the first heater 26b, which is provided at a center among the plurality of first heaters 26b, is a circular shape. Another first heater 26b has an annular shape that surrounds the first heater 26b provided at the center. That is, the other first heaters 26b except for the first heater 26b provided at the center have a band shape extending in the circumferential direction. In one exemplary embodiment, some of the plurality of first heaters 26b are provided at least within the outer circumferential region 260b. For example, among the plurality of first heaters 26b, the first heater 26b, which extends at the outermost side with respect to the central axis AX, is provided within the outer circumferential region 260b, and the other first heaters 26b are provided within the substrate mounting region 260a. The plurality of first heaters 26b heat a plurality of zones Z1 in which the plurality of first heaters 26b are disposed, respectively.

The plurality of first heaters 26b may also be arranged in the circumferential direction with respect to the central axis AX. That is, the plurality of zones Z1 may have a central zone, and a plurality of zones which are arranged in the circumferential direction within the plurality of coaxial regions outside the central zone, and the plurality of first heaters 26*b* may be provided in the plurality of zones Z1, respectively.

Figure 6:
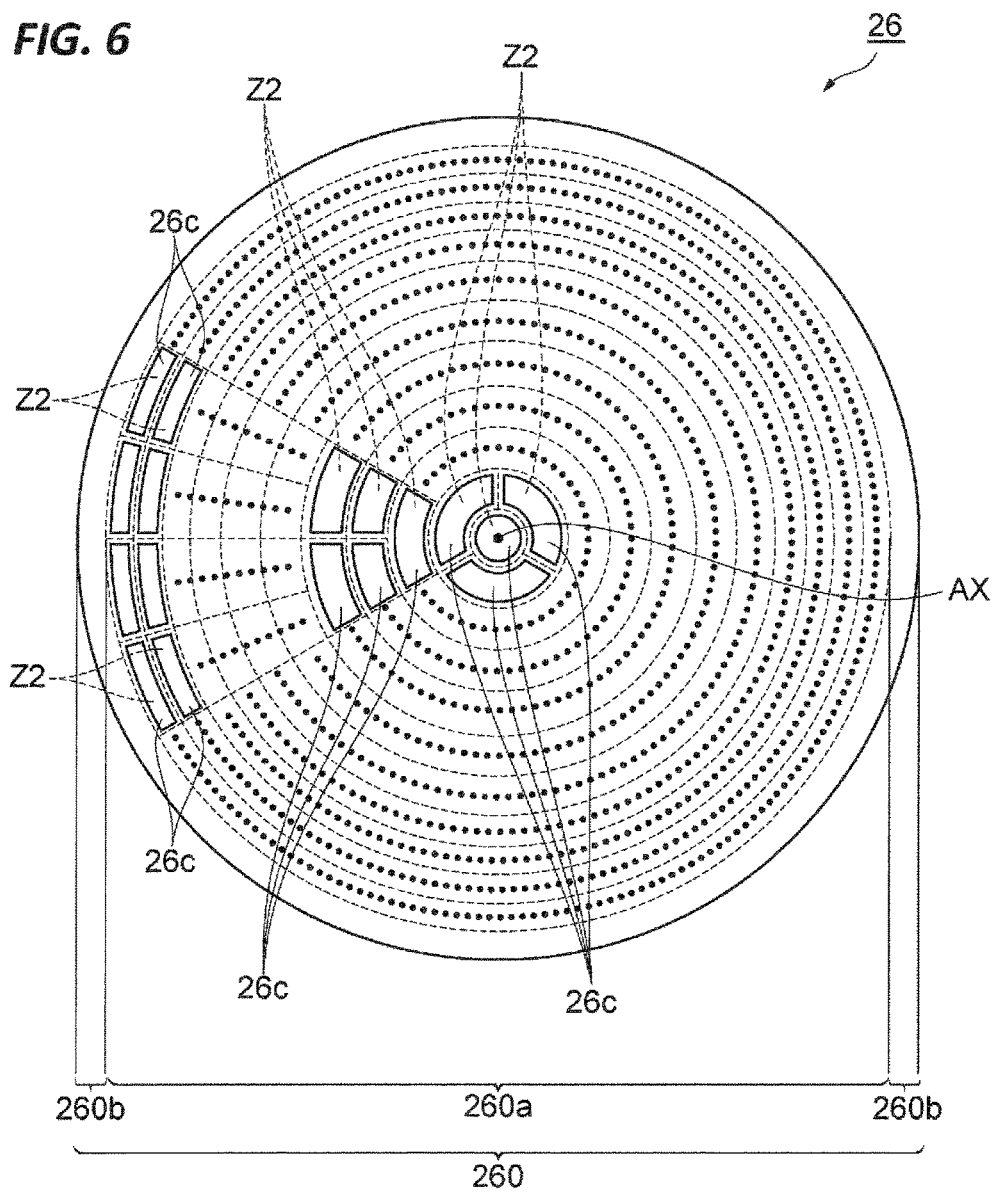
FIG. 6 is a top plan view illustrating an example of a layout of a plurality of second heaters of the stage illustrated in FIG. 3.

FIG. 6 is a top plan view illustrating an example of a layout of the plurality of second heaters of the stage illustrated in FIG. 3. FIG. 6 illustrates a layout of the plurality of second heaters 26*c* in the plane orthogonal to the central axis AX. The plurality of second heaters 26*c* are provided to be distributed within the substrate mounting region 260*a*. As illustrated in FIG. 6, as an example, the plurality of second heaters 26*c* are provided in a plurality of zones Z2, respectively. The plurality of zones Z2 include a central zone which intersects the central axis AX, and a plurality of zones which are arranged in the circumferential direction within a plurality of coaxial regions with respect to the central axis AX. Further, the plurality of zones Z2, that is, the plurality of second heaters 26*c* are included within any of the plurality of zones Z1.

As illustrated in FIGS. 3 and 4, the plurality of second heaters 26*c* are provided between the plurality of first heaters 26*b* and the upper surface of the chuck main body 26 (i.e., the upper surface of the substrate mounting region 260*a*). That is, the plurality of second heaters 26*c* are provided above the plurality of first heaters 26*b*. Further, the plurality of second heaters 26*c* may be provided below the plurality of first heaters 26*b*.

Figure 7:
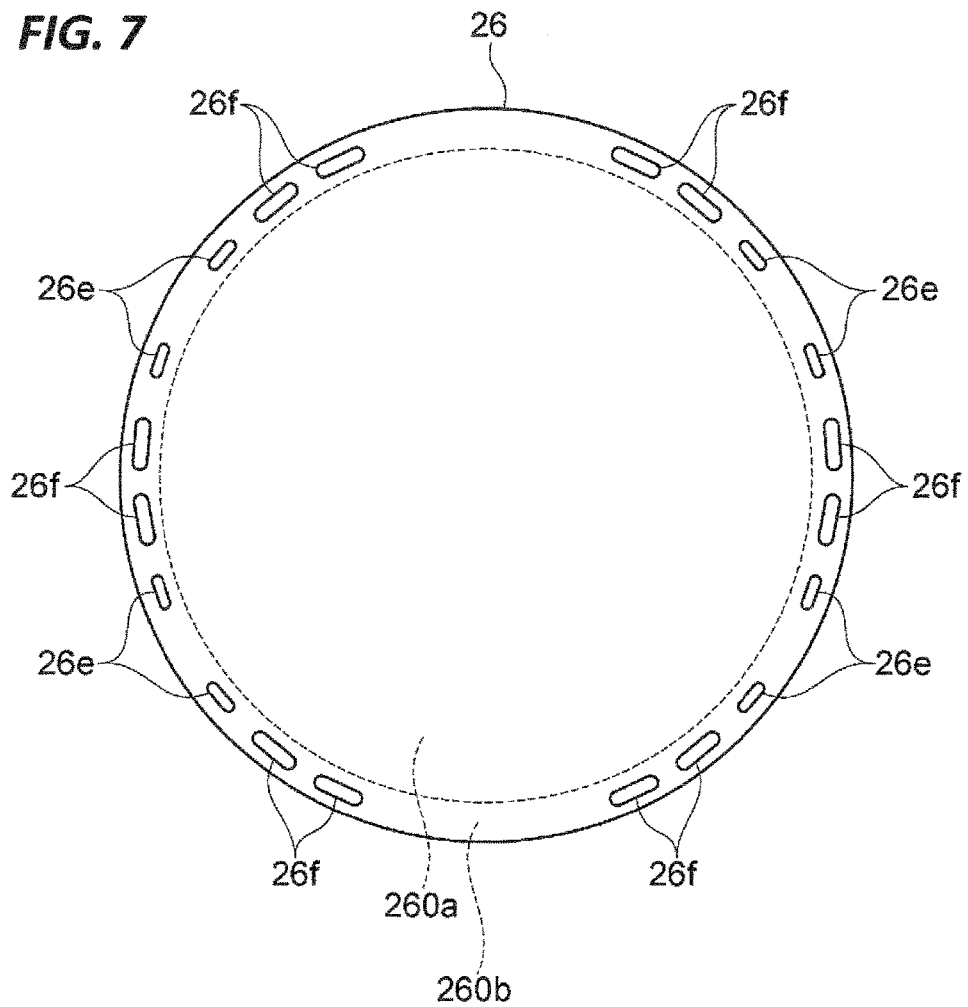
FIG. 7 is a top plan view illustrating an example of a layout of terminals on a rear surface of a chuck main body of the stage illustrated in FIG. 3.
Figure 8:
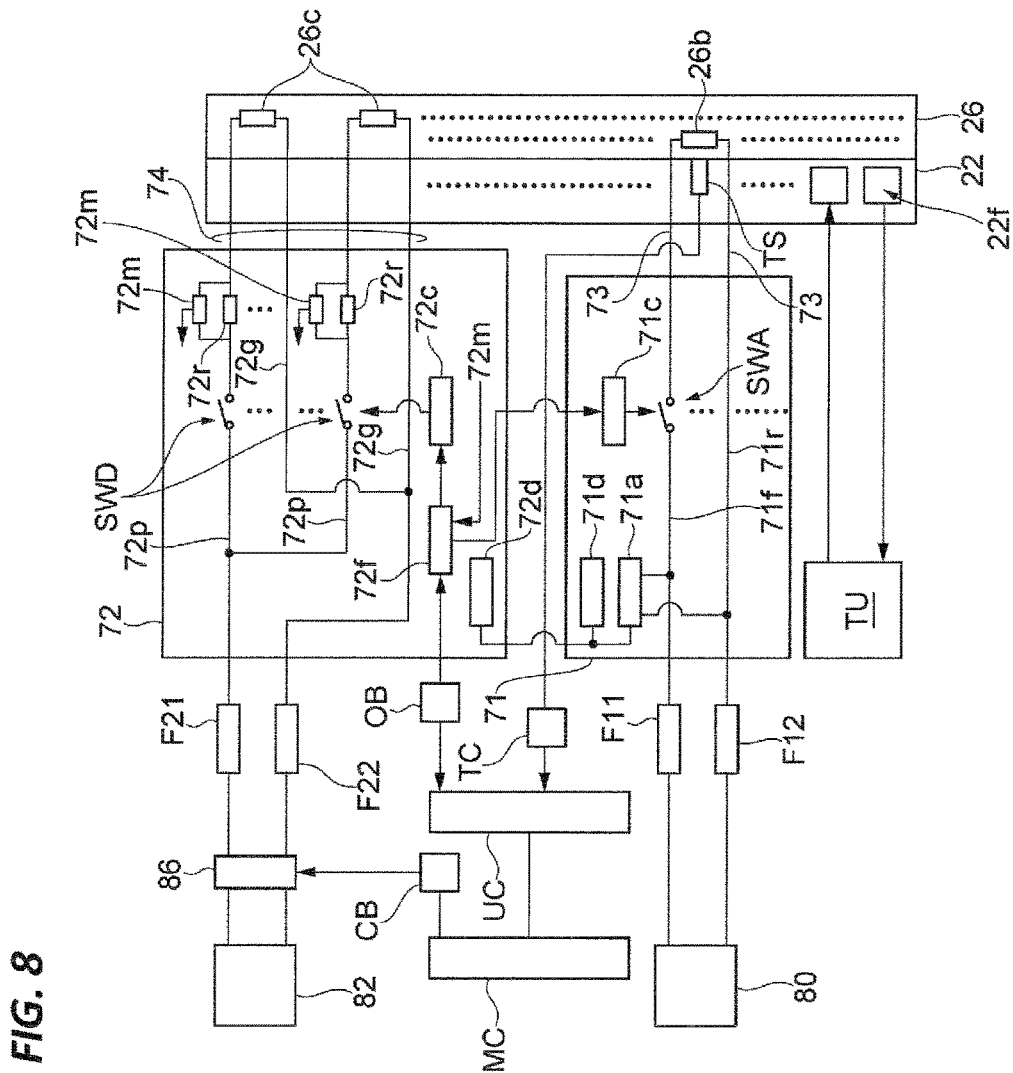
FIG. 8 is a view illustrating a configuration of the exemplary embodiment related to the control of the stage illustrated in FIG. 3.

The plurality of first heaters 26*b* generate heat by being driven by an output from a first power source 80. The output of the first power source 80 is an alternating current output or a direct current output. That is, the output of the first power source 80 may be any one of an alternating current output and a direct current output. The plurality of second heaters 26*c* generate heat by being driven by an output from a second power source 82. The output of the second power source 82 is an alternating current output or a direct current output. That is, the output of the second power source 82 may be any one of an alternating current output and a direct current output. In one exemplary embodiment, the plurality of first heaters 26*b* are driven by alternating current by the alternating current output from the first power source, and the plurality of second heaters 26*c* are driven by direct current by the direct current output from the second power source. The stage 16 has a first heater controller 71 and a second heater controller 72 in order to drive the plurality of first heaters 26*b* and the plurality of second heaters 26*c*. Hereinafter, the reference is made to FIGS. 7 and 8 together with FIGS. 3 and 4. FIG. 7 is a top plan view illustrating an example of a layout of terminals on the rear surface of the chuck main body of the stage illustrated in FIG. 3. FIG. 8 is a view illustrating a configuration of the exemplary embodiment related to control of the stage illustrated in FIG. 3.

A plurality of first power feeding lines 73 are electrically connected to the plurality of first heaters 26*b*, respectively. The pair of first power feeding lines 73 is connected to the plurality of first heaters 26*b*, respectively. A plurality of second power feeding lines 74 are electrically connected to the plurality of second heaters 26*c*, respectively. The pair of second power feeding lines 74 is connected to the plurality of second heaters 26*c*, respectively. In the one exemplary embodiment, the plurality of second power feeding lines 74 may be provided by a plurality of flexible printed circuit boards. Each of the plurality of flexible printed circuit boards provides the several corresponding second power feeding lines 74 among the plurality of second power feeding lines 74. In one exemplary embodiment, the first heater controller 71, the plurality of first power feeding lines 73, the second heater controller 72, and the plurality of second power feeding lines 74 are provided in the accommodation space 18*s*.

As illustrated in FIG. 7, a plurality of terminals 26*e* and a plurality of terminals 26*f* are provided on the rear surface of the chuck main body 26. The plurality of first power feeding lines 73 are connected to the plurality of terminals 26*e*, respectively. The plurality of terminals 26*e* are connected to the plurality of first heaters 26*b* through inner wires in the chuck main body 26. The plurality of second power feeding lines 74 are connected to the plurality of terminals 26*f*, respectively. In a case in which the plurality of second power feeding lines 74 are provided by the plurality of flexible printed circuit boards, the plurality of terminals 26*f* are grouped as a plurality of terminal groups. The plurality of terminals 26*f* are connected to the plurality of second heaters 26*c* through inner wires in the chuck main body 26. In one exemplary embodiment, the plurality of terminals 26*e* and the plurality of terminals 26*f* are provided within the outer circumferential region 260*b*. In one exemplary embodiment, the plurality of terminals 26*e* and the plurality of terminals 26*f* (or the plurality of terminal groups) are distributed in the circumferential direction around the entire circumference of the outer circumferential region 260*b*.

The plurality of first power feeding lines 73 are connected to the first heater controller 71. The first heater controller 71 is connected to the first power source 80. The first heater controller 71 is configured to drive the plurality of first heaters 26*b* by the output from the first power source 80. In one exemplary embodiment, the first heater controller 71 is configured to drive the plurality of first heaters 26*b* by a plurality of first outputs produced by distributing the output from the first power source 80. The first heater controller 71 supplies the plurality of first outputs to the plurality of first heaters 26*b* through the plurality of first power feeding lines 73 in order to drive the plurality of first heaters 26*b*. The first heater controller 71 is configured to individually adjust power amounts of the plurality of first outputs to be applied to the plurality of first heaters 26*b*. In one exemplary embodiment, the output from the first power source 80 is an alternating current output, and the first heater controller 71 is configured to drive the plurality of first heaters 26*b* by alternating current by the plurality of first outputs which each are alternating current outputs.

The plurality of second power feeding lines 74 are connected to the second heater controller 72. The second heater controller 72 is connected to the second power source 82. The second heater controller 72 is configured to drive the plurality of second heaters 26*c* by the output from the second power source 82. In one exemplary embodiment, the second heater controller 72 is configured to drive the plurality of second heaters 26*c* by a plurality of second outputs produced by distributing the output from the second power source 82. Electric power for operating the plurality of second heaters 26*c* is lower than electric power for operating the plurality of first heaters 26*b*. The second heater controller 72 supplies the plurality of second outputs to the plurality of second heaters 26*c* through the plurality of second power feeding lines 74 in order to drive the plurality of second heaters 26*c*. The second heater controller 72 is configured to individually adjust power amounts of the plurality of second outputs to be applied to the plurality of second heaters 26*c*.

In one exemplary embodiment, the output from the second power source 82 is a direct current output, and the second heater controller 72 is configured to drive the plurality of second heaters 26*c* by direct current by the plurality of second outputs which each are direct current outputs. In a case in which the first power source 80 is an alternating current power source and the second power source 82 is a direct current power source, the second power source 82 is connected to the first power source 80 as illustrated. In this case, the second power source 82 is an AC/DC converter for converting the alternating current output from the first power source 80 into direct current, and for example, the second power source 82 is a switching power source.

As illustrated in FIG. 8, a plurality of wires 71*f* and a plurality of wires 71*r* are provided in the first heater controller 71. One end of each of the plurality of wires 71*f* is connected to the corresponding first heater 26*b*, among the plurality of first heaters 26*b*, through the corresponding first power feeding line 73 among the plurality of first power feeding lines 73. One end of each of the plurality of wires 71*r* is connected to the corresponding first heater 26*b*, among the plurality of first heaters 26*b*, through the corresponding first power feeding line 73 among the plurality of first power feeding lines 73.

The other end of each of the plurality of wires 71*f* is connected to the first power source 80 via a filter F11 (first filter). Specifically, the other end of each of the plurality of wires 71*f* is connected to a terminal ET11 illustrated in FIG. 3, and the terminal ET11 is connected to a terminal FT11 of a filter unit FU. The filter unit FU has the filter F11, a filter F12 (first filter), a filter F21 (second filter), and a filter F22 (second filter). The filter unit FU including the filter F11, the filter F12, the filter F21, and the filter F22 is provided outside the power feeding unit 18 with respect to the aforementioned accommodation space 18*s*.

The terminal FT11 is connected to the filter F11. The filter F11 inhibits an inflow of the high-frequency waves to the first power source 80. The filter F11 is, for example, an LC filter. The terminal FT11 is connected to one end of a coil of the filter F11. The coil of the filter F11 partially constitutes a power feeding line between the first power source 80 and the first heater controller 71. The other end of the coil of the filter F11 is connected to the ground through a condenser of the filter F11.

The other end of each of the plurality of wires 71*r* is connected to the first power source 80 via the filter F12. Specifically, the other end of each of the plurality of wires 71*r* is connected to a terminal ET12 illustrated in FIG. 3, and the terminal ET12 is connected to a terminal FT12 of the filter unit FU. The terminal FT12 is connected to the filter F12. The filter F12 inhibits an inflow of the high-frequency waves to the first power source 80. The filter F12 is, for example, an LC filter. The terminal FT12 is connected to one end of a coil of the filter F12. The coil of the filter F12 partially constitutes a wire between the first power source 80 and the first heater controller 71. The other end of the coil of the filter F12 is connected to the ground through a condenser of the filter F12.

Figure 10:
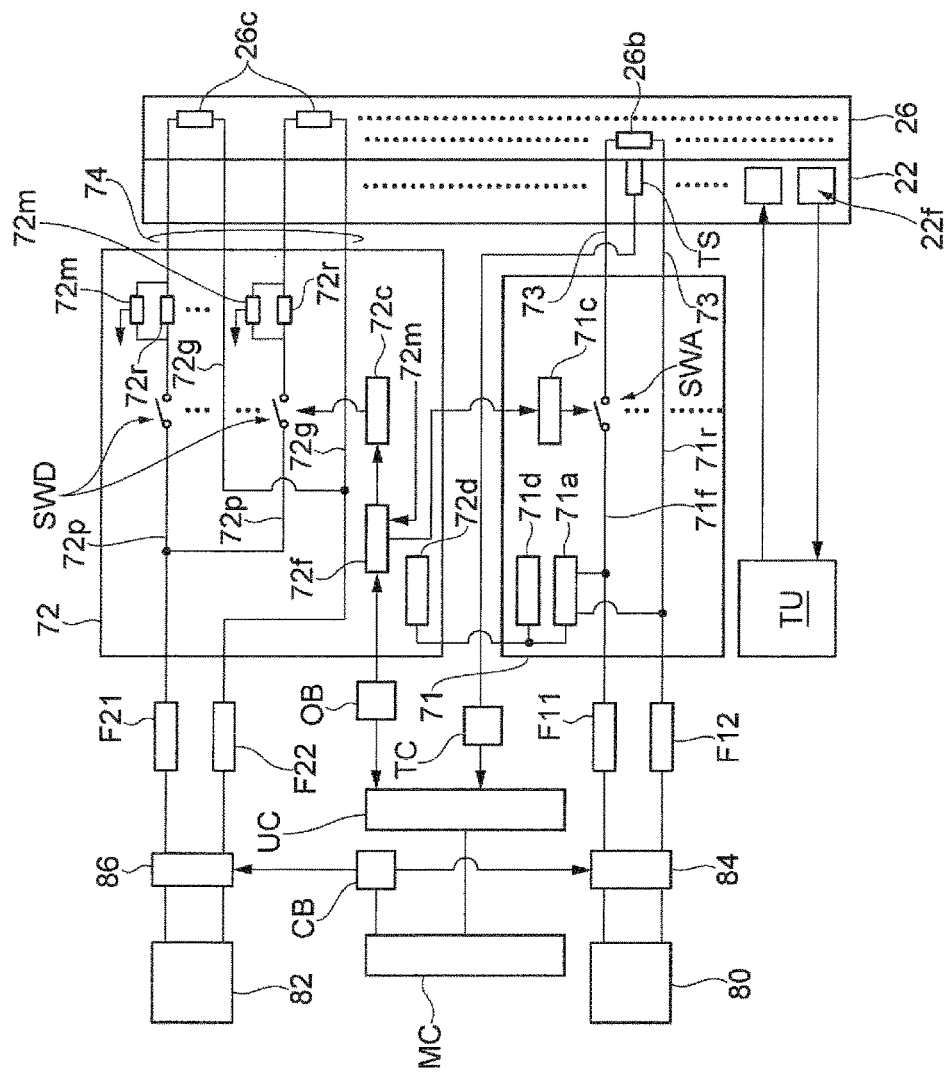
FIG. 10 is a view illustrating a configuration of another exemplary embodiment related to control of the stage illustrated in FIG. 3.

In an exemplary embodiment to be described below with reference to FIG. 10, a switching unit 84 is provided on the power feeding line and the wire between the first power source 80 and the first heater controller 71. Specifically, the switching unit 84 is provided between the filter F11 and the first power source 80 and between the filter F12 and the first power source 80. The switching unit 84 is configured to cut off the connection between the first power source 80 and the first heater controller 71.

As illustrated in FIG. 8, a plurality of wires 72*p* and a plurality of wires 72*g* are provided in the second heater controller 72. One end of each of the plurality of wires 72*p* is connected to the corresponding second heater 26*c*, among the plurality of second heaters 26*c*, through the corresponding second power feeding line 74 among the plurality of second power feeding lines 74. One end of each of the plurality of wires 72*g* is connected to the corresponding second heater 26*c*, among the plurality of second heaters 26*c*, through the corresponding second power feeding line 74 among the plurality of second power feeding lines 74.

The other end of each of the plurality of wires 72*p* is connected to the second power source 82 via the filter F21. Specifically, the other end of each of the plurality of wires 72*p* is connected to a terminal ET21 illustrated in FIG. 3, and the terminal ET21 is connected to a terminal FT21 of the filter unit FU. The terminal FT21 is connected to the filter F21. The filter F21 inhibits an inflow of the high-frequency waves to the second power source 82. The filter F21 is, for example, an LC filter. The terminal FT21 is connected to one end of a coil of the filter F21. The coil of the filter F21 partially constitutes a power feeding line between the second power source 82 and the second heater controller 72. The other end of the coil of the filter F21 is connected to the ground through a condenser of the filter F21.

The other end of each of the plurality of wires 72*g* is connected to the second power source 82 via the filter F22. Specifically, the other end of each of the plurality of wires 72*g* is connected to a separate terminal, and the separate terminal is connected to a separate terminal of the filter unit FU. The separate terminal of the filter unit FU is connected to the filter F22. The filter F22 is a filter that inhibits an inflow of the high-frequency waves to the second power source 82. The filter F22 is, for example, an LC filter. The separate terminal of the filter unit FU is connected to one end of a coil of the filter F22. The coil of the filter F22 partially constitutes a wire between the ground of the second power source 82 and the second heater controller 72. The other end of the coil of the filter F22 is connected to the ground through a condenser of the filter F22.

A switching unit 86 is provided on the power feeding line and the wire between the second power source 82 and the second heater controller 72. Specifically, the switching unit 86 is provided between the filter F21 and the second power source 82 and between the filter F22 and the second power source 82. The switching unit 86 is configured to cut off the connection between the second power source 82 and the second heater controller 72.

As illustrated in FIG. 8, the first heater controller 71 has a control circuit 71*c* and a plurality of switching elements SWA. The plurality of switching elements SWA are provided on the plurality of wires 71*f*, respectively. Each of the plurality of switching elements SWA may be a semiconductor switching element, for example, a triac. The first heater controller 71 receives an output (e.g., an alternating current output of AC 200 V) from the first power source 80, and generates a plurality of first outputs (e.g., alternating current outputs of AC 200 V) for the plurality of first heaters 26*b*. In the first heater controller 71, a state in which the plurality of first outputs are supplied to the plurality of first heaters 26*b* and a state in which the supply of the plurality of first outputs is cut off are switched as a state of the plurality of switching elements SWA is switched between a conductive state and a cut-off state. The states of the plurality of switching elements SWA are set by the control circuit 71*c*.

In an exemplary embodiment in which the first power source 80 is an alternating current power source, the first heater controller 71 further has an AC/DC converter 71*a* and a DC/DC converter 71*d*. The AC/DC converter 71*a* generates a direct current output (e.g., direct current output of DC 15 V) from an alternating current output of the first power source 80. The DC/DC converter 71*d* generates a separate direct current output (e.g., direct current output of DC 3.3 V) from the direct current output generated by the AC/DC converter 71*a*. The direct current output generated by the DC/DC converter 71*d* is used as a power source for operating a device, such as the control circuit 71*c*, in the first heater controller 71.

As illustrated in FIGS. 4 and 8, the stage 16 is provided with a plurality of temperature sensors TS. The plurality of temperature sensors TS are mounted on the stage 16 so as to measure temperatures of the plurality of zones Z1 of the chuck main body 26. For example, the plurality of temperature sensors TS measure, at the rear surface of the chuck main body 26, the temperatures of the plurality of zones Z1. Each of the plurality of temperature sensors TS is, for example, a fluorescent temperature sensor. The plurality of temperature sensors TS are connected to a sensor circuit TC. An output of each of the plurality of temperature sensors TS is converted into an electrical digital signal for the sensor circuit TC, that is, a measured value of the temperature of each of the plurality of zones Z1. The measured value of the temperature of each of the plurality of zones Z1 is provided to an upper level controller UC.

The second heater controller 72 has an inner controller 72*f*, a control circuit 72*c*, and a plurality of switching elements SWD. The plurality of switching elements SWD are provided on the plurality of wires 72*p*, respectively. Each of the plurality of switching elements SWD may be a semiconductor switching element, for example, a photo MOS relay. The second heater controller 72 receives an output (e.g., direct current output of DC 15V) from the second power source 82 and generates the plurality of second outputs for the plurality of second heaters 26*c*. In the second heater controller 72, a state in which the plurality of second outputs are supplied to the plurality of second heaters 26*c* and a state in which the supply of the plurality of second outputs is cut off are switched as a state of the plurality of switching elements SWD is switched between a conductive state and a cut-off state. The states of the plurality of switching elements SWD are set by the control circuit 72*c*.

The second heater controller 72 further has a DC/DC converter 72*d*. The DC/DC converter 72*d* generates a separate direct current output (e.g., direct current output of DC 3.3 V) from the direct current output generated by the AC/DC converter 71*a*. The direct current output generated by the DC/DC converter 72*d* is used as power source for operating a device, such as the inner controller 72*f* and the control circuit 72*c*, in the second heater controller 72.

A plurality of resistance elements 72*r* are provided on the plurality of wires 72*p*, respectively. The second heater controller 72 further has a plurality of measuring devices 72*m*. Each of the plurality of measuring devices 72*m* measures voltage between both ends of each of the plurality of resistance elements 72*r* and measures electric current flowing through each of the plurality of wires 72*p*. Measured values of the voltage and measured values of the electric current acquired by the plurality of measuring devices 72*m* are provided to the upper level controller UC through the inner controller 72*f* and an optical bridge OB.

The inner controller 72*f* of the second heater controller 72 is connected to the upper level controller UC through the optical bridge OB. The inner controller 72*f* may be configured by, for example, a field-programmable gate array (FPGA). The inner controller 72*f* communicates with the upper level controller UC through the optical bridge OB and controls the control circuit 71*c* and the control circuit 72*c*. The upper level controller UC may be configured by a microcomputer provided with a processor such as a CPU and a storage device such as a memory. In the plasma processing apparatus 10, set data of an in-plane temperature distribution of the substrate W are provided to the upper level controller UC from the main control unit MC.

Based on the set data of the in-plane temperature distribution of the substrate W, the upper level controller UC determines target temperatures of the plurality of zones Z1 and target values of power amounts per predetermined time of the plurality of second outputs. The upper level controller UC transmits a control signal to the inner controller 72*f* through the optical bridge OB so that the plurality of first outputs of the power amounts (power amounts per predetermined time) in accordance with the target temperatures of the plurality of zones Z1 are supplied to the plurality of first heaters 26*b*. The inner controller 72*f* controls the control circuit 71*c* in response to the control signal from the upper level controller UC, thereby controlling the power amounts of the plurality of first outputs supplied to the plurality of first heaters 26*b*.

The upper level controller UC performs feedback control of the power amounts of the plurality of first outputs supplied to the plurality of first heaters 26*b* so as to reduce errors between the target temperatures of the plurality of zones Z1 and the measured values of the temperatures of the plurality of zones Z1 which are acquired by the plurality of temperature sensors TS and the sensor circuit TC. The feedback control of the power amounts of the plurality of first outputs supplied to the plurality of first heaters 26*b* is, for example, PID control. Further, during the feedback control of the power amounts of the plurality of first outputs supplied to the plurality of first heaters 26*b*, the upper level controller UC may obtain errors between the target temperatures of the plurality of zones Z1 and a moving average value of the temperatures of the plurality of zones Z1 which are obtained from time-series data of the measured values of the temperatures of the plurality of zones Z1.

In one exemplary embodiment, the plurality of first outputs of the first heater controller 71 have substantially the same and constant electric power. In this exemplary embodiment, the first heater controller 71 is configured to control a plurality of first duty ratios. The plurality of first duty ratios are ratios of supply durations for which the plurality of first outputs are supplied to the plurality of first heaters 26*b*, respectively, relative to a predetermined duration (e.g., 100 milliseconds). The upper level controller UC assigns the plurality of first duty ratios to the inner controller 72*f* through the optical bridge OB. The inner controller 72*f* switches the respective states (the conductive state and the cut-off state) of the plurality of switching elements SWA within a predetermined time in accordance with the plurality of assigned first duty ratios by controlling the control circuit 71*c*. Therefore, the supply of the plurality of first outputs to the plurality of first heaters 26*b* and the cut-off of the supply of the plurality of first outputs to the plurality of first heaters 26*b* are alternately switched.

The upper level controller UC adjusts the plurality of first duty ratios so as to reduce the errors between the target temperatures of the plurality of zones Z1 and the measured values of the temperatures of the plurality of zones Z1 which are acquired by the plurality of temperature sensors TS and the sensor circuit TC. That is, the upper level controller UC performs feedback control of the plurality of first duty ratios. The feedback control of the plurality of first duty ratios is, for example, PID control. Further, during the feedback control of the plurality of first duty ratios, the upper level controller UC may obtain the errors between the target temperatures of the plurality of zones Z1 and the moving average value of the temperatures of the plurality of zones Z1 which are obtained from time-series data of the measured values of the temperatures of the plurality of zones Z1.

The upper level controller UC transmits the control signal to the inner controller 72f through the optical bridge OB so that the plurality of second outputs in accordance with the target values of the power amounts per predetermined time, which is determined based on the set data of the in-plane temperature distribution of the substrate W, are supplied to the plurality of second heaters 26c. The inner controller 72f controls the control circuit 72c in response to the control signal from the upper level controller UC, thereby controlling the power amounts (power amounts per predetermined time) of the plurality of second outputs supplied to the plurality of second heaters 26c.

Based on the plurality of measured values of electric power, the upper level controller UC performs the feedback control of the power amounts of the plurality of second outputs. The feedback control of the power amounts of the plurality of second outputs is, for example, PID control. Each of the plurality of measured values of electric power is the product of the measured value of voltage and the measured value of electric current which are acquired by the corresponding measuring device 72m among the plurality of measuring devices 72m. Further, in the case in which each of the plurality of second outputs is an alternating current output, each of the plurality of measured values of electric power may be a root-mean-square value obtained from the product of the measured value of voltage and the measured value of electric current which are acquired by the corresponding measuring device 72m among the plurality of measuring devices 72m. In another exemplary embodiment, each of the power amounts of the plurality of second outputs may be controlled based on the time-series moving average value of the product of the measured value of voltage and the measured value of electric current which are acquired by the corresponding measuring device 72m among the plurality of measuring devices 72m. Further, in the case in which each of the plurality of second outputs is an alternating current output, each of the plurality of measured values of electric power may be a time-series moving average value of the root-mean-square value obtained from the product of the measured value of voltage and the measured value of electric current which are acquired by the corresponding measuring device 72m among the plurality of measuring devices 72m.

In one exemplary embodiment, the plurality of second outputs of the second heater controller 72 have substantially the same and constant electric power. In this exemplary embodiment, the second heater controller 72 is configured to control a plurality of second duty ratios. The plurality of second duty ratios are ratios of supply durations for which the plurality of second outputs are supplied to the plurality of second heaters 26c, respectively, relative to a predetermined duration (e.g., 100 milliseconds). The upper level controller UC assigns the plurality of second duty ratios to the inner controller 72f through the optical bridge OB. The inner controller 72f switches the respective states (the conductive state and the cut-off state) of the plurality of switching elements SWD within a predetermined time in accordance with the plurality of assigned second duty ratios by controlling the control circuit 72c. Therefore, the supply of the plurality of second outputs to the plurality of second heaters 26c and the cut-off of the supply of the plurality of second outputs to the plurality of second heater 26c are alternately switched.

The upper level controller UC adjusts the plurality of second duty ratios so as to reduce an error between the target value of the power amount and the product of the measured value of electric power of each of the plurality of second outputs and the corresponding second duty ratio among the plurality of second duty ratios. That is, the upper level controller UC performs feedback control of the plurality of second duty ratios. The feedback control of the plurality of second duty ratios is, for example, PID control. Further, during the feedback control of the plurality of second duty ratios, the upper level controller may obtain an error between the target value and the time-series moving average value of the product of the measured value of electric power of each of the plurality of second outputs and the corresponding second duty ratio.

Figure 9:
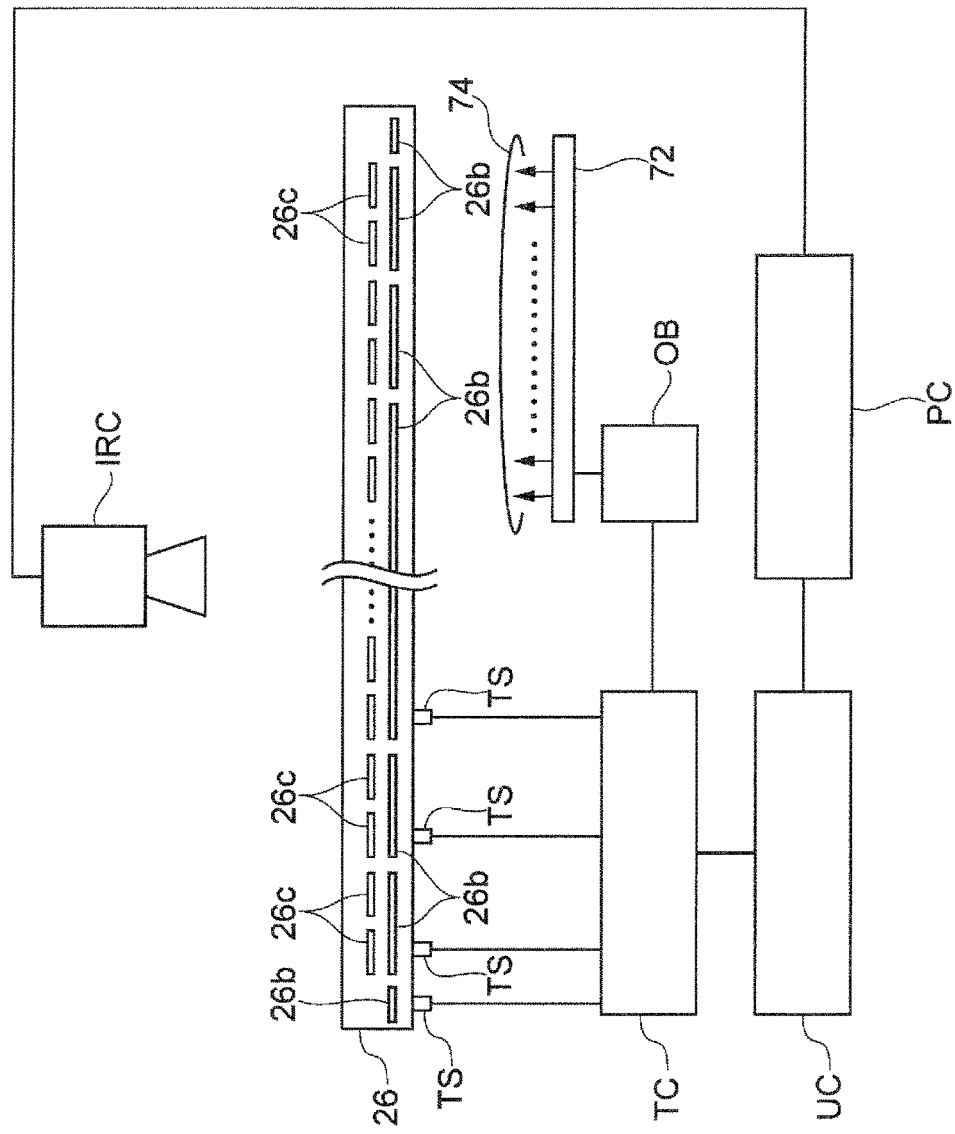
FIG. 9 is a view for explaining a method for obtaining a function of converting a temperature increase amount caused by each of the plurality of second heaters into a power amount per predetermined time of a second output supplied to each of the plurality of second heaters.

As described above, based on the set data of the in-plane temperature distribution of the substrate W, the upper level controller UC determines the target values of the power amounts per predetermined time of the plurality of second outputs. Specifically, the upper level controller UC determines target temperature increase amounts caused by the plurality of second heaters 26c based on the set data of the in-plane temperature distribution of the substrate W, and determines the target values of the power amounts per predetermined time of the second outputs supplied to the plurality of second heaters 26c based on the target temperature increase amount. For this reason, the upper level controller UC holds in advance a function of converting the temperature increase amounts caused by the plurality of second heaters 26c into the power amounts per predetermined time of the second outputs supplied to the plurality of second heaters 26c. Hereinafter, a method for obtaining a function of converting the temperature increase amounts caused by the plurality of second heaters 26c into the power amounts per predetermined time of the second outputs supplied to the plurality of second heaters 26c will be described with reference to FIG. 9.

When obtaining the function, the second outputs are provided to the particular second heaters 26c, among the plurality of second heaters 26c, which have the temperature sensors TS (hereinafter, referred to as "particular temperature sensors TS") disposed at lower sides of the particular second heaters 26c. Further, in the example illustrated in FIG. 9, the number of particular second heaters 26c is three. Further, infrared energy within a particular region in the upper surface of the chuck main body 26 above the particular second heater 26c is acquired by an infrared camera IRC. Further, the number of particular regions is equal to the number of particular second heaters 26c. A measured value of the infrared energy within the particular region acquired by the infrared camera IRC is inputted to a computer PC. A measured value of a temperature from the particular temperature sensor TS is also inputted to the computer PC. Further, in the computer PC, a conversion coefficient for converting the measured value of the infrared energy into the temperature from the measured value of the temperature from the particular temperature sensor TS and the measured value of the infrared energy within the particular region from the infrared camera IRC is made.

After the conversion coefficient is made, the second output is provided to the particular second heater 26c. Further, the infrared energy within the particular region is measured by the infrared camera IRC. The measured value of the infrared energy within the particular region acquired by the infrared camera IRC is inputted to the computer PC. Further, in the computer PC, the temperature within the particular region is calculated from the measured value of the infrared energy within the particular region by using the conversion coefficient. This process is repeated by changing the power amount per predetermined time of the second output by changing the aforementioned second duty ratio. Further, based on a relationship between the temperature increase amount obtained from the calculated temperature of the particular region and the power amount per predetermined time of the provided second output, a function of converting the temperature increase amount into the power amount per predetermined time of the second output is obtained in respect to each of the particular second heaters 26c.

The upper level controller UC specifies the power amount per predetermined time of the second output corresponding to the target temperature increase amount by using the corresponding function, thereby determining the target value of the power amount per predetermined time of the second output supplied to each of the plurality of second heaters 26c. Further, a function obtained by using any one of the second heaters 26c is used to determine the target value of the power amount per predetermined time of the second output supplied to another second heater 26c that is included in the same zone Z1 as any one second heater 26c among the particular second heaters 26c.

The reference is made to FIGS. 4 and 8 again. As described above, the switching unit 86 is provided on the power feeding line between the second power source 82 and the second heater controller 72. The switching unit 86 is configured to cut off the connection between the second power source 82 and the second heater controller 72. The switching unit 86 is configured by, for example, a magnetic contactor. The switching unit 86 is connected to a control unit CB. The control unit CB controls the switching unit 86 so as to set a connection state between the second heater controller 72 and the second power source 82.

In order to drive the plurality of second heaters 26c, the main control unit MC transmits a control signal to the control unit CB to connect the second heater controller 72 and the second power source 82 through the switching unit 86. Meanwhile, in a case in which the plurality of second heaters 26c are not used, that is, the driving of the plurality of second heaters 26c is stopped, the main control unit MC transmits a control signal to the control unit CB to cut off the connection of the second heater controller 72 and the second power source 82 through the switching unit 86. When the connection between the second heater controller 72 and the second power source 82 is cut off, the main control unit MC transmits to the upper level controller UC a signal for transmitting the disconnection between the second heater controller 72 and the second power source 82. Therefore, an erroneous operation of the upper level controller UC is prevented by the signal transmitted to the upper level controller UC from the second heater controller 72.

Hereinafter, the reference is made to FIG. 10. FIG. 10 is a view illustrating a configuration of another exemplary embodiment related to control of the stage illustrated in FIG. 3. The exemplary embodiment illustrated in FIG. 10 differs from the exemplary embodiment illustrated in FIG. 8 in that the switching unit 84 is provided on the power feeding line between the first power source 80 and the first heater controller 71. The switching unit 84 is configured to cut off the connection between the first power source 80 and the first heater controller 71. The switching unit 84 is configured by, for example, a magnetic contactor. The switching unit 84 is connected to the control unit CB. The control unit CB controls the switching unit 86 as described above, and further, controls the switching unit 84 so as to set the connection state between the first heater controller 71 and the first power source 80.

In order to drive the plurality of first heaters 26b, the main control unit MC transmits a control signal to the control unit CB to connect the first heater controller 71 and the first power source 80 through the switching unit 84. Meanwhile, in a case in which the plurality of first heaters 26b are not used, that is, the driving of the plurality of first heaters 26b is stopped, the main control unit MC transmits a control signal to the control unit CB to cut off the connection of the first heater controller 71 and the first power source 80 through the switching unit 84. When the connection between the first heater controller 71 and the first power source 80 is cut off, the main control unit MC transmits to the upper level controller UC a signal for transmitting the disconnection between the first heater controller 71 and the first power source 80. Therefore, an erroneous operation of the upper level controller UC is prevented by the signal transmitted to the upper level controller UC from the first heater controller 71.

Referring back to FIG. 1, the plasma processing method MT1 will be described. The plasma processing method MT1 may be performed by the plasma processing apparatus 10 that adopts the exemplary embodiment illustrated in FIG. 8 or the exemplary embodiment illustrated in FIG. 10. As illustrated in FIG. 1, the plasma processing method MT1 includes a process ST1 and a process ST2. In the example illustrated in FIG. 1, the process ST2 is performed after the process ST1 is performed, but the process ST1 may be performed after the process ST2 is performed.

The plasma processing method MT1 is performed in a state in which the substrate W is placed on the chuck main body 26. In the process ST1, a plasma processing (first plasma processing) is performed on the substrate W. In the process ST2, a separate plasma processing (second plasma processing) is performed on the substrate W.

In the process ST1, the processing gas is supplied into the chamber 12c, and pressure in the chamber 12c is set to a predetermined pressure. In the process ST1, plasma of the processing gas supplied into the chamber 12c is generated. In the process ST1, the high-frequency waves are supplied to the base 22 from the second high-frequency power source 64. In the process ST1, in addition to the high-frequency waves from the second high-frequency power source 64, the high-frequency waves from the first high-frequency power source 62 may be used to generate plasma. In the process ST1, the plurality of first heaters 26b are driven by the plurality of first outputs from the first heater controller 71, and the plurality of second heaters 26c are driven by the plurality of second outputs from the second heater controller 72. In the process ST1, the heat exchange medium is supplied to the flow path 22f from the chiller unit TU.

In the process ST2, the processing gas is supplied into the chamber 12c, and pressure in the chamber 12c is set to a predetermined pressure. The processing gas used in the process ST2 may be identical to or different from the processing gas used in the process ST1. In the process ST2, plasma of the processing gas supplied into the chamber 12c is generated. In the process ST2, the high-frequency waves are supplied to the base 22 from the second high-frequency power source 64. The electric power of the high-frequency waves supplied to the base 22 in the process ST2 is higher than the electric power of the high-frequency waves supplied to the base 22 in the process ST1. The electric power of the high-frequency waves supplied to the base 22 in the process ST2 is, for example, 2,000 W or higher. In the process ST2, in addition to the high-frequency waves from the second high-frequency power source 64, the high-frequency waves from the first high-frequency power source 62 may be used to generate plasma.

In the process ST2, the plurality of first heaters 26b are driven by the plurality of first outputs from the first heater controller 71. In the process ST2, the driving of the plurality of second heaters 26c is stopped, and the connection between the second power source 82 and the second heater controller 72 is cut off by the switching unit 86. In the process ST2, the heat exchange medium is supplied to the flow path 22f from the chiller unit TU.

In the process ST1 of the plasma processing method MT1, the plurality of first heaters 26b are driven, the plurality of second heaters 26c are driven, and the high-frequency waves with comparatively low power are supplied to the base 22. That is, the plasma processing in the process ST1 is processing for coping with the precise adjustment of the in-plane temperature distribution of the substrate W and the requirement of low power of the high-frequency wave. Meanwhile, in the process ST2, the driving of at least the plurality of second heaters 26c is stopped, and the high-frequency waves with comparatively high power are supplied to the base 22. That is, the plasma processing in the process ST2 is processing for coping with lower precision of the in-plane temperature distribution of the substrate W and the requirement of higher power of the high-frequency waves in comparison with the plasma processing in the process ST1. Therefore, according to the plasma processing method MT1, a plurality of processes having different power of the high-frequency waves supplied to the base 22 and having different required in-plane temperature distributions of the substrate W are performed by using the single plasma processing apparatus 10. In addition, the connection between the second power source 82 and the second heater controller 72 is cut off while performing the process ST2. Therefore, the high-frequency waves supplied to the base 22 are prevented from entering the second power source 82.

Figure 11:
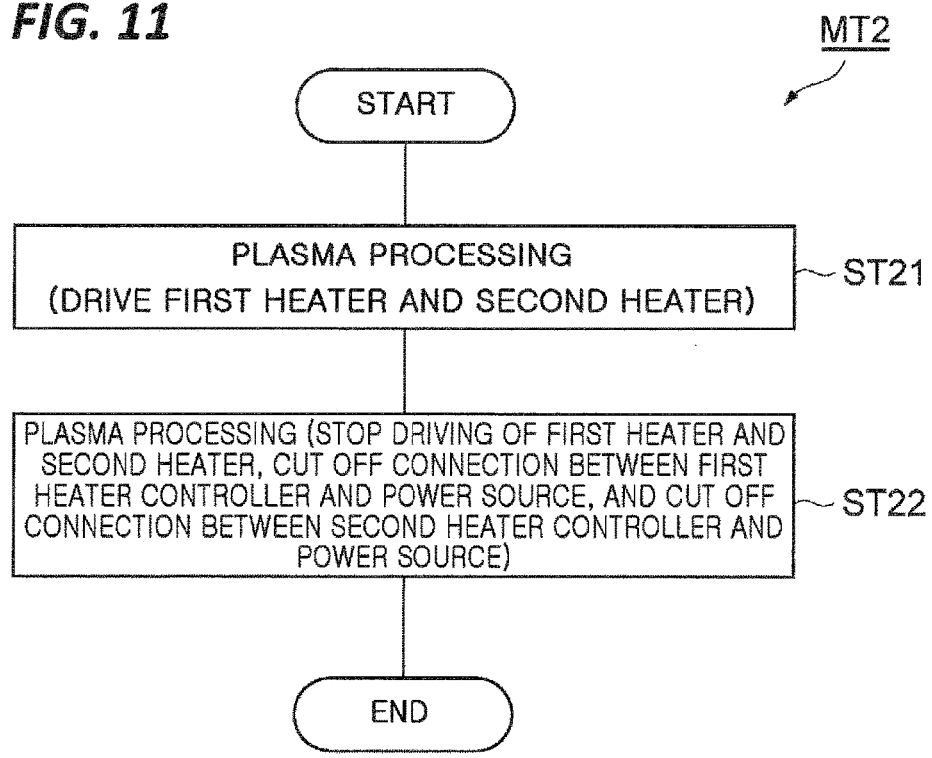
FIG. 11 is a flowchart illustrating a plasma processing method according to another exemplary embodiment.

Hereinafter, a plasma processing method according to another exemplary embodiment will be described with reference to FIG. 11. FIG. 11 is a flowchart illustrating a plasma processing method according to another exemplary embodiment. A plasma processing method MT2 illustrated in FIG. 11 may be performed by the plasma processing apparatus 10 which adopts the exemplary embodiment illustrated in FIG. 10. As illustrated in FIG. 11, the plasma processing method MT2 includes a process ST21 and a process ST22. In the example illustrated in FIG. 11, the process ST22 is performed after the process ST21 is performed, but the process ST21 may be performed after the process ST22 is performed.

The plasma processing method MT2 is performed in a state in which the substrate W is placed on the chuck main body 26. In the process ST21, a plasma processing (first plasma processing) is performed on the substrate W. The process ST21 is the same as the process ST1.

In the process ST22, separate plasma processing (second plasma processing) is performed on the substrate W. In the process ST22, the processing gas is supplied into the chamber 12c, and pressure in the chamber 12c is set to a predetermined pressure. The processing gas used in the process ST22 may be identical to or different from the processing gas used in the process ST21. In the process ST22, plasma of the processing gas supplied into the chamber 12c is generated. In the process ST22, the high-frequency waves are supplied to the base 22 from the second high-frequency power source 64. The electric power of the high-frequency waves supplied to the base 22 in the process ST22 is higher than the electric power of the high-frequency waves supplied to the base 22 in the process ST21. The electric power of the high-frequency waves supplied to the base 22 in the process ST22 is, for example, 2,000 W or higher. In the process ST22, in addition to the high-frequency waves from the second high-frequency power source 64, the high-frequency waves from the first high-frequency power source 62 may be used to generate plasma.

In the process ST22, the driving of the plurality of second heaters 26c is stopped, and the connection between the second power source 82 and the second heater controller 72 is cut off by the switching unit 86. In addition, in the process ST22, the driving of the plurality of first heaters 26b is stopped, and the connection between the first power source 80 and the first heater controller 71 is cut off by the switching unit 84. In the process ST22, the heat exchange medium is supplied to the flow path 22f from the chiller unit TU. In the process ST22, the plurality of first heaters 26b and the plurality of second heaters 26c are not used to control the in-plane temperature distribution of the substrate W, but only the heat exchange medium from the chiller unit TU is used to control the in-plane temperature distribution of the substrate W. In the process ST22, the high-frequency waves supplied to the base 22 are prevented from entering the first power source 80 and the second power source 82.

Figure 12:
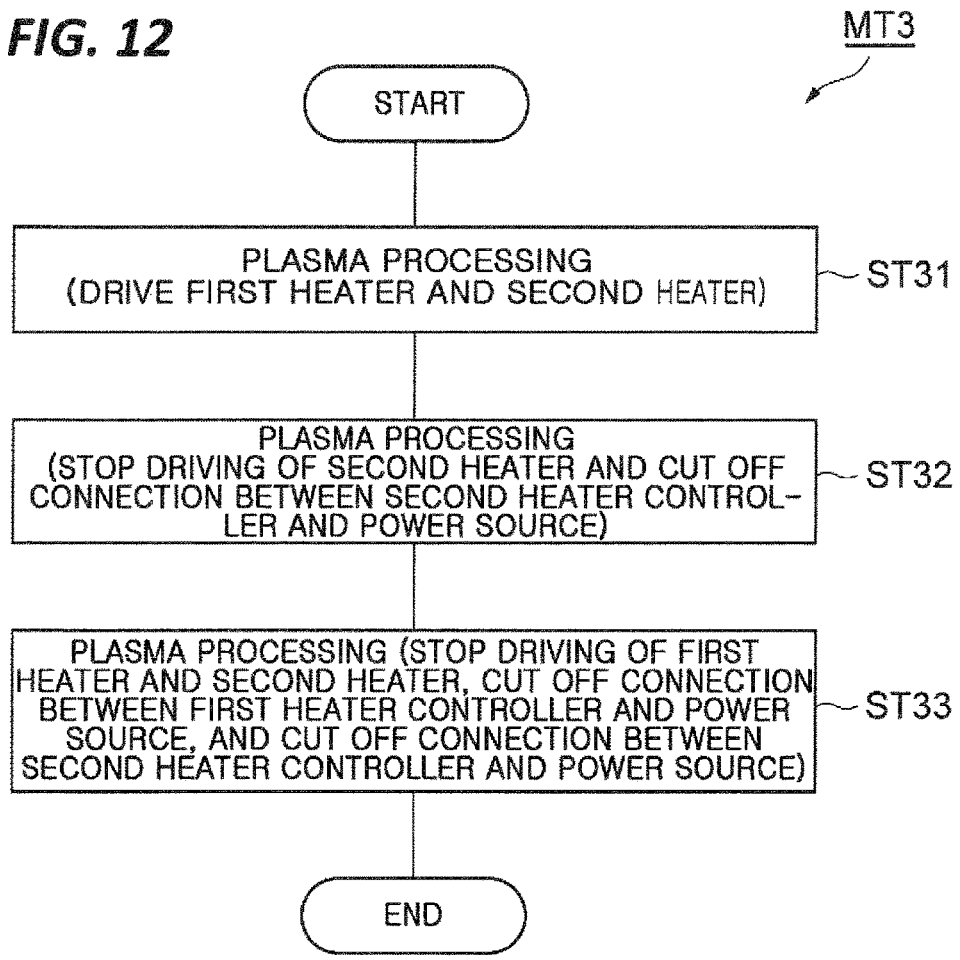
FIG. 12 is a flowchart illustrating a plasma processing method according to still another exemplary embodiment.

Hereinafter, a plasma processing method according to still another exemplary embodiment will be described with reference to FIG. 12. FIG. 12 is a flowchart illustrating a plasma processing method according to still another exemplary embodiment. A plasma processing method MT3 illustrated in FIG. 12 may be performed by the plasma processing apparatus 10 which adopts the exemplary embodiment illustrated in FIG. 10. As illustrated in FIG. 12, the plasma processing method MT3 includes a process ST31, a process ST32, and a process ST33. In the example illustrated in FIG. 12, the process ST32 is performed after the process ST31 is performed, and the process ST33 is performed after the process ST32 is performed, but the process ST31, the process ST32, and the process ST33 may be performed in any order.

The process ST31 is the same as the process ST1 or the process ST21. The process ST32 is the same as the process ST2. The process ST33 is the same as the process ST22. The processing gas used in the process ST31, the processing gas used in the process ST32, and the processing gas used in the process ST33 may be identical to or different from one another. The electric power of the high-frequency waves supplied to the base 22 in the process ST32 is higher than the electric power of the high-frequency waves supplied to the base 22 in the process ST31. The electric power of the high-frequency waves supplied to the base 22 in the process ST33 is higher than the electric power of the high-frequency waves supplied to the base 22 in the process ST32.

Figure 13:
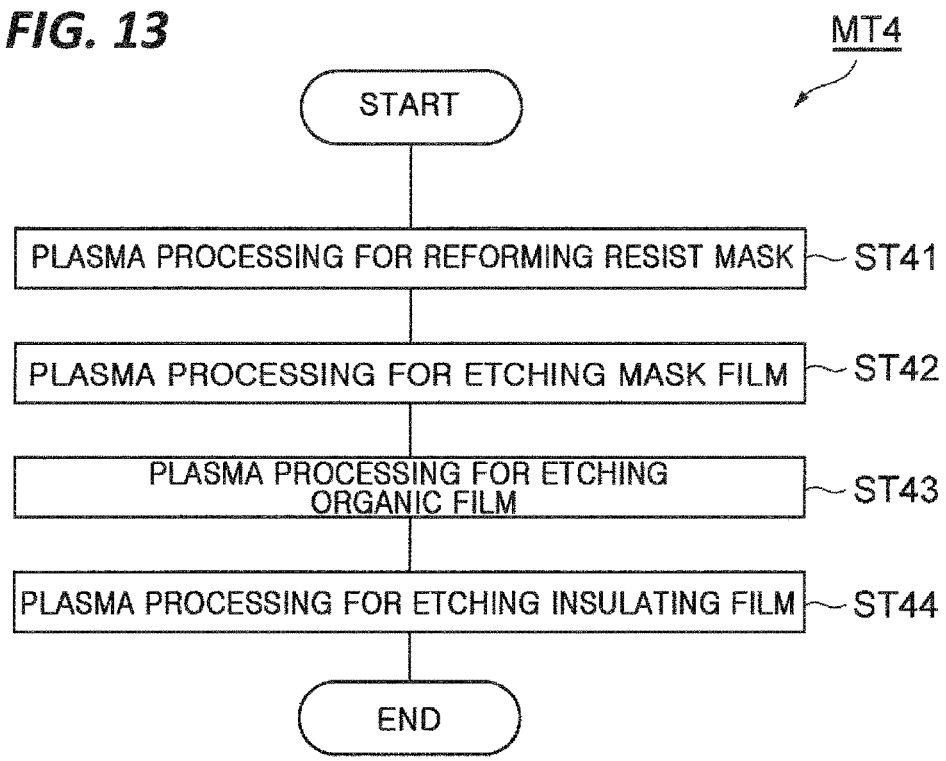
FIG. 13 is a flowchart illustrating a plasma processing method according to yet another exemplary embodiment.
Figure 14:
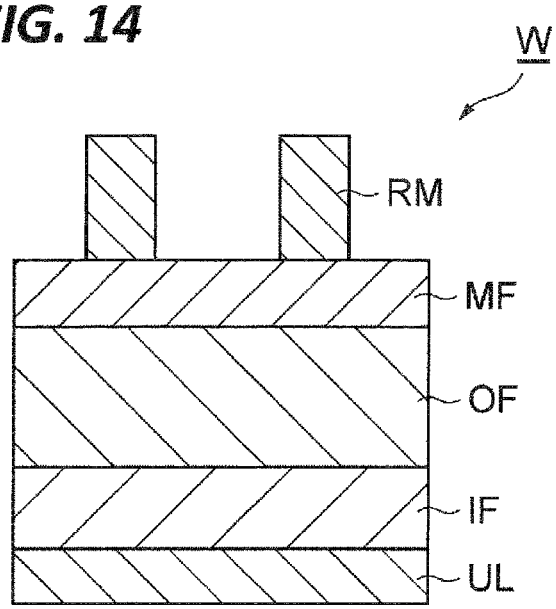
FIG. 14 is a partially enlarged cross-sectional view of a substrate of an example before performing the plasma processing method illustrated in FIG. 13.

Hereinafter, a plasma processing method according to yet another exemplary embodiment will be described with reference to FIG. 13. FIG. 13 is a flowchart illustrating a plasma processing method according to yet another exemplary embodiment. A plasma processing method MT4 illustrated in FIG. 13 may be performed by the plasma processing apparatus 10 which adopts the exemplary embodiment illustrated in FIG. 8 or the exemplary embodiment illustrated in FIG. 10. The plasma processing method MT4 may be applied to process the substrate W illustrated in FIG. 14. FIG. 14 is a partially enlarged cross-sectional view of a substrate of an example before performing the plasma processing method illustrated in FIG. 13.

The substrate W illustrated in FIG. 14 has an insulating film IF, an organic film OF, a mask film MF, and a resist mask RM. The insulating film IF is provided on an under layer UL. The insulating film IF is made of, for example, a silicon oxide. The organic film OF is provided on the insulating film IF. The organic film OF is made of an organic material. The organic film OF may include, for example, an organic dielectric film such as a spin-on carbon film, or an amorphous carbon film. The mask film MF is provided on the organic film OF. The mask film MF may be, for example, a silicon-containing antireflection film. The resist mask RM is provided on the mask film MF. The resist mask RM has a pattern that provides openings. The pattern of the resist mask RM may be formed by a photolithography technology.

Figure 15A:
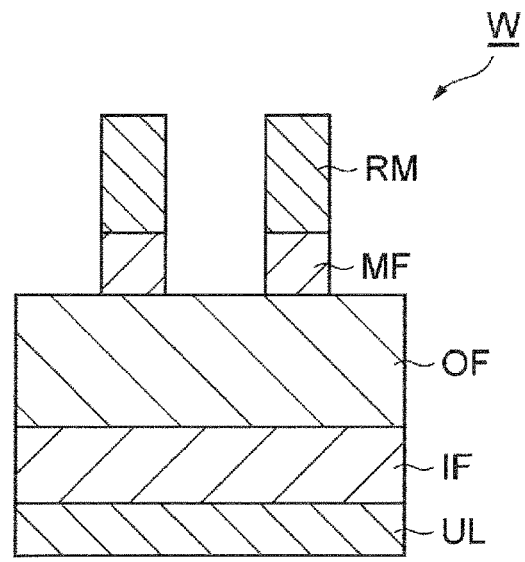
FIGS. 15A and 15B are partially enlarged cross-sectional views of a substrate of an example while performing the plasma processing method illustrated in FIG. 13.
Figure 15B:
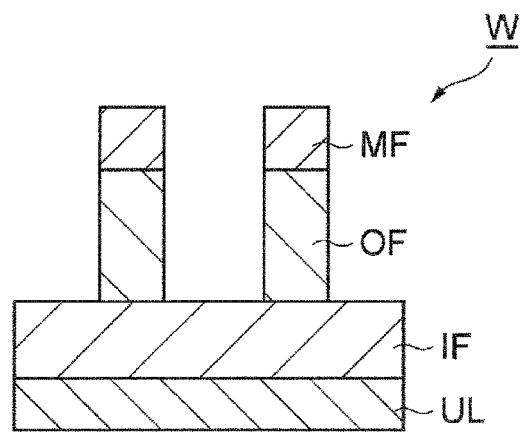
Figure 15C:
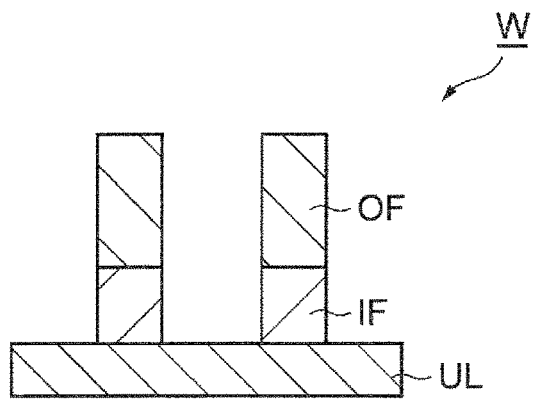
FIG. 15C is a partially enlarged cross-sectional view of a substrate of an example after performing the plasma processing method illustrated in FIG. 13.

Hereinafter, the reference is made to FIGS. 15A, 15B, and 15C together with FIGS. 13 and 14. FIGS. 15A and 15B are partially enlarged cross-sectional views of a substrate of an example while performing the plasma processing method illustrated in FIG. 13, and FIG. 15C is a partially enlarged cross-sectional view of a substrate of an example after performing the plasma processing method illustrated in FIG. 13. The plasma processing method MT4 is performed in a state in which the substrate W is placed on the chuck main body 26.

As illustrated in FIG. 13, the plasma processing method MT4 includes a process ST41, a process ST42, a process ST43, and a process ST44. In the process ST41, a plasma processing (first plasma processing) is performed on the substrate W illustrated in FIG. 14. In the process ST42, another plasma processing (third plasma processing) is performed on the substrate W after applying the process ST41. In the process ST43, still another plasma processing (fourth plasma processing) is performed on the substrate W after applying the process ST42. In the process ST44, yet another plasma processing (second plasma processing) is performed on the substrate W after applying the process ST43.

The plasma processing method MT4 starts with the process ST41. In the process ST41, the processing gas is supplied into the chamber 12c, and pressure in the chamber 12c is set to a predetermined pressure. The processing gas used in the process ST41 includes hydrogen-containing gas and rare gas (e.g., argon gas). The hydrogen-containing gas is, for example, hydrogen gas ($H_2$ gas), or hydrogen halide gas such as hydrogen bromide gas. In the process ST41, plasma of the processing gas supplied into the chamber 12c is generated. In the process ST41, the high-frequency waves are supplied to the upper electrode 30 from the first high-frequency power source 62 in order to generate plasma. In the process ST41, the high-frequency waves may be or may not be supplied to the base 22 from the second high-frequency power source 64. That is, in the process ST41, the electric power of the high-frequency waves supplied to the base 22 is comparatively low or zero.

In the process ST41, a temperature of the substrate W is set to a comparatively low temperature, for example, a temperature of −60° C. to −20° C. In the process ST41, a deviation of an in-plane temperature of the substrate W may be 1° C. or less. In the process ST41, the plurality of first heaters 26b are driven by the plurality of first outputs from the first heater controller 71, and the plurality of second heaters 26c are driven by the plurality of second outputs from the second heater controller 72. In the process ST41, the heat exchange medium is supplied to the flow path 22f from the chiller unit TU. In the process ST41, the resist mask RM is reformed by active species of hydrogen from the plasma of the processing gas.

In the subsequent process ST42, the processing gas is supplied into the chamber 12c, and pressure in the chamber 12c is set to a predetermined pressure. The processing gas used in the process ST42 includes fluorine-containing gas. The fluorine-containing gas is, for example, $SF_6$ gas, or fluorocarbon gas such as $CF_4$ gas. In the process ST42, plasma of the processing gas supplied into the chamber 12c is generated. In the process ST42, the high-frequency waves are supplied to the upper electrode 30 from the first high-frequency power source 62 in order to generate plasma. In the process ST42, the high-frequency waves may be or may not be supplied to the base 22 from the second high-frequency power source 64. That is, in the process ST42, the electric power of the high-frequency waves supplied to the base 22 is comparatively low or zero.

In the process ST42, a temperature of the substrate W is set to a comparatively low temperature, for example, a temperature of 0° C. to 30° C. In the process ST42, a deviation of an in-plane temperature of the substrate W may be 1° C. or less. In the process ST42, the plurality of first heaters 26b are driven by the plurality of first outputs from the first heater controller 71, and the plurality of second heaters 26c are driven by the plurality of second outputs from the second heater controller 72. In the process ST42, the heat exchange medium is supplied to the flow path 22f from the chiller unit TU. In the process ST42, the mask film MF is etched by active species of fluorine from the plasma of the processing gas. By the process ST42, the pattern of the resist mask RM is transferred onto the mask film MF, as illustrated in FIG. 15A.

In the subsequent process ST43, the processing gas is supplied into the chamber 12c, and pressure in the chamber 12c is set to a predetermined pressure. The processing gas used in the process ST43 includes oxygen-containing gas and rare gas (e.g., argon gas). The oxygen-containing gas is, for example, oxygen gas ($O_2$ gas), $CO_2$ gas, or CO gas. In the process ST43, plasma of the processing gas supplied into the chamber 12c is generated. In the process ST43, the high-frequency waves are supplied to the upper electrode 30 from the first high-frequency power source 62 in order to generate plasma. In the process ST43, the high-frequency waves may be or may not be supplied to the base 22 from the second high-frequency power source 64. That is, in the process ST43, the electric power of the high-frequency waves supplied to the base 22 is comparatively low or zero.

In the process ST43, a temperature of the substrate W is set to a comparatively low temperature, for example, a temperature of 0° C. to 20° C. In the process ST43, a deviation of an in-plane temperature of the substrate W may be 1° C. or less. In the process ST43, the plurality of first heaters 26b are driven by the plurality of first outputs from the first heater controller 71, and the plurality of second heaters 26c are driven by the plurality of second outputs from the second heater controller 72. In the process ST43, the heat exchange medium is supplied to the flow path 22f from the chiller unit TU. In the process ST43, the organic film OF is etched by active species of oxygen from the plasma of the processing gas. By the process ST43, the pattern of the mask film MF is transferred onto the organic film OF, as illustrated in FIG. 15B. Further, the resist mask RM is removed while performing the process ST43.

In the subsequent process ST44, the processing gas is supplied into the chamber 12c, and pressure in the chamber 12c is set to a predetermined pressure. The processing gas used in the process ST44 includes fluorine-containing gas. The fluorine-containing gas is, for example, fluorocarbon gas such as $CF_4$ gas. In the process ST44, plasma of the processing gas supplied into the chamber 12c is generated. In the process ST44, the high-frequency waves are supplied to the upper electrode 30 from the first high-frequency power source 62 in order to generate plasma. In the process ST44, the high-frequency waves are supplied to the base 22 from the second high-frequency power source 64. In the process ST44, the electric power of the high-frequency waves supplied to the base 22 is higher than the electric power of the high-frequency waves supplied to the base 22 in each of the process ST41, the process ST42, and the process ST43, and the electric power of the high-frequency waves in the process ST44 is, for example, 2,000 W or higher.

In the process ST44, a temperature of the substrate W is set to a comparatively high temperature, for example, a temperature of 20° C. to 50° C. A deviation of an in-plane temperature of the substrate W may be 5° C. to 10° C. In the process ST44, the driving of the plurality of second heaters 26c is stopped, and the connection between the second power source 82 and the second heater controller 72 is cut off by the switching unit 86. In the process ST44, the plurality of first heaters 26b may be driven by the plurality of first outputs from the first heater controller 71. In this case, the plasma processing apparatus 10, which adopts the exemplary embodiment illustrated in FIG. 8 or the exemplary embodiment illustrated in FIG. 10, may be used. Alternatively, in the process ST44, the driving of the plurality of first heaters 26b may be further stopped, and the connection between the first power source 80 and the first heater controller 71 may be cut off by the switching unit 84. In this case, the plasma processing apparatus 10, which adopts the exemplary embodiment illustrated in FIG. 10, may be used. In the process ST44, the heat exchange medium is supplied to the flow path 22f from the chiller unit TU. In the process ST44, the insulating film IF is etched by active species from the plasma of the processing gas. By the process ST44, the pattern of the organic film OF is transferred onto the insulating film IF, as illustrated in FIG. 15C. Further, the mask film MF may be removed while performing the process ST44.

In the plasma processing method MT4, the resist mask RM is reformed by the plasma processing in the process ST41, the mask film MF is etched by the plasma processing in the process ST42, and the organic film OF is etched by the plasma processing in the process ST43. Since the reforming of the resist mask RM, the etching of the mask film MF, and the etching of the organic film OF are performed to form a mask for etching the insulating film IF, it is required to perform the processing with high precision. The plasma processing in the process ST41, the plasma processing in the process ST42, and the plasma processing in the process ST43 are suitable to reform the resist mask RM, etch the mask film MF, and etch the organic film OF because the plasma processing in the process ST41, the plasma processing in the process ST42, and the plasma processing in the process ST43 use the high-frequency waves having comparatively low power in a state in which the in-plane temperature distribution of the substrate W is precisely adjusted. Meanwhile, in the plasma processing in the process ST44, the driving of at least the plurality of second heaters 26c is stopped, and the insulating film IF is etched by using the high-frequency waves having high power. The plasma processing in the process ST44 is suitable for the etching of the insulating film IF which does not require the precise adjustment of the in-plane temperature distribution of the substrate W but requires the usage of the high-frequency waves having high power.

While the various exemplary embodiments have been described above, various modified aspects may be made without being limited to the aforementioned exemplary embodiments. For example, in the plasma processing methods according to the aforementioned various exemplary embodiments, plasma processing apparatuses using any plasma source, such as an inductively coupled plasma processing apparatus and a plasma processing apparatus for generating plasma by using surface waves such as microwaves, may be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method performed using a plasma processing apparatus that includes a chamber main body providing a chamber, a stage configured to support a substrate in the chamber, and a high-frequency power source,
wherein the stage includes:
   a power feeding unit that provides a transmission path configured to transmit high-frequency waves from the high-frequency power source, and
   an electrostatic chuck including a conductive base provided on the power feeding unit and electrically connected to the power feeding unit, and a chuck main body provided on the base and configured to hold the substrate with electrostatic attractive force,
wherein the chuck main body includes:
   a plurality of first heaters provided in the chuck main body to be distributed on a plane in the chuck main body which is orthogonal to a central axis of the chuck main body, and
   a plurality of second heaters provided in the chuck main body to be distributed on a separate plane in the chuck main body which is orthogonal to a central axis of the chuck main body, the number of second heaters being larger than the number of first heaters,
wherein the plasma processing apparatus further includes:
   a first heater controller configured to drive the plurality of first heaters by an alternating current output or a direct current output from a first power source; and
   a second heater controller configured to drive the plurality of second heaters by an alternating current output or a direct current output from a second power source which has electric power lower than electric power of the output from the first power source,
wherein the plasma processing method is performed in a state in which the substrate is placed on the chuck main body,
wherein the plasma processing method comprises:
a process of applying a first plasma processing to the substrate in the chamber, and;
a process of applying a second plasma processing to the substrate in the chamber,
wherein the electric power of the high-frequency waves supplied to the base from the high-frequency power source in the process of applying the second plasma processing is higher than the electric power of the high-frequency waves supplied to the base from the high-frequency power source in the process of applying the first plasma processing, wherein, in the process of applying the first plasma processing, the plurality of first heaters are driven by a plurality of first outputs from the first heater controller, and the plurality of second heaters are driven by a plurality of second outputs from the second heater controller, and wherein, in the process of applying the second plasma processing, the driving of at least the plurality of second heaters is stopped, and the connection between the second power source and the second heater controller is cut off.

2. The plasma processing method of claim 1, wherein, in the process of applying the second plasma processing, the driving of the plurality of first heaters is stopped, and the connection between the first power source and the first heater controller is cut off.

3. The plasma processing method of claim 2, wherein the base has a flow path formed therein through which a heat exchange medium is supplied, and Wherein, in the process of applying the second plasma processing, a temperature of the substrate is controlled by supplying the heat exchange medium to the flow path in the base.

4. The plasma processing method of claim 1, wherein, in the process of applying the second plasma processing, the electric power of the high-frequency waves supplied to the base from the high-frequency power source is 2,000 W or higher.

5. The plasma processing method of claim 1, wherein the substrate has an insulating film formed of a silicon oxide, an organic film provided on the insulating film, a mask film provided on the organic film, and a resist mask provided on the mask film, wherein the plasma processing method further comprises:

a process of applying a third plasma processing to the substrate in the chamber between the process of applying the first plasma processing and the process of applying the second plasma processing, and a process of applying a fourth plasma processing to the substrate in the chamber between the process of applying the third plasma processing and the process of applying the second plasma processing, wherein in the process of applying the first plasma processing, active species of hydrogen from plasma of hydrogen-containing gas generated in the chamber are supplied to the resist mask, wherein, in the process of applying the third plasma processing, the plurality of first heaters are driven, the plurality of second heaters are driven, and the mask film is etched by the active species from the plasma of the processing gas generated in the chamber, wherein, in the process of applying the fourth plasma processing, the plurality of first heaters are driven, the plurality of second heaters are driven, and the organic film is etched by the active species from the plasma of the processing gas generated in the chamber, wherein the electric power of the high-frequency waves supplied to the base from the high-frequency power source in the process of applying the second plasma processing is higher than the electric power of the high-frequency waves supplied to the base from the high-frequency power source in the process of applying the third plasma processing and the electric power of the high-frequency waves supplied to the base from the high-frequency power source in the process of applying the fourth plasma processing, and wherein, in the process of applying the second plasma processing, the insulating film is etched by the active species of the plasma of the processing gas generated in the chamber.

6. The plasma processing method of claim 1, further comprising a process of applying separate plasma processing to the substrate in the chamber, wherein the electric power of the high-frequency waves supplied to the base from the high-frequency power source in the process of applying the second plasma processing is higher than the electric power of the high-frequency waves supplied to the base from the high-frequency power source in the process of applying the first plasma processing, wherein the electric power of the high-frequency waves supplied to the base from the high-frequency power source in the process of applying the separate plasma processing is higher than the electric power of the high-frequency waves supplied to the base from the high-frequency power source in the process of applying the second plasma processing, wherein, in the process of applying the second plasma processing, the plurality of first heaters are driven, the driving of the plurality of second heaters is stopped, and the connection between the second power source and the second heater controller is cut off, and wherein, in the process of applying the separate plasma processing, the driving of the plurality of first heaters is stopped, the connection between the first power source and the first heater controller is cut off, the driving of the plurality of second heaters is stopped, and the connection between the second power source and the second heater controller is cut off.

7. The plasma processing method of claim 1, wherein the first heater controller is configured to drive the plurality of first heaters by alternating current by the plurality of first outputs of alternating current generated by distributing an alternating current output which is an output from the first power source, and wherein the second heater controller is configured to drive the plurality of second heaters by direct current by the plurality of second outputs of direct current generated by distributing a direct current output which is an output from the second power source.

* * * * *